(12) United States Patent
Motowaki

(10) Patent No.: US 11,564,341 B2
(45) Date of Patent: Jan. 24, 2023

(54) REEL HOLDING DEVICE ARRANGED IN COMPONENT MOUNTING MACHINE AND ROBOT SYSTEM INCLUDING REEL HOLDING DEVICE

(71) Applicant: Fanuc Corporation, Yamanashi (JP)

(72) Inventor: Yoshio Motowaki, Yamanashi (JP)

(73) Assignee: Fanuc Corporation, Yamanashi (JP)

( * ) Notice: Subject to any disclaimer, the term of this patent is extended or adjusted under 35 U.S.C. 154(b) by 515 days.

(21) Appl. No.: 16/717,318

(22) Filed: Dec. 17, 2019

(65) Prior Publication Data
US 2020/0214182 A1    Jul. 2, 2020

(30) Foreign Application Priority Data

Dec. 26, 2018 (JP) .............................. JP2018-243588

(51) Int. Cl.
| | |
|---|---|
| *B23P 19/00* | (2006.01) |
| *H05K 13/04* | (2006.01) |
| *B25J 11/00* | (2006.01) |

(52) U.S. Cl.
CPC ........ *H05K 13/0417* (2013.01); *B25J 11/005* (2013.01); *H05K 13/046* (2013.01)

(58) Field of Classification Search
CPC . B25J 15/0052; B25J 11/005; H05K 13/0417; H05K 13/046
See application file for complete search history.

(56) References Cited

U.S. PATENT DOCUMENTS

| | | | |
|---|---|---|---|
| 8,171,620 B2 | 5/2012 | Yonemitsu et al. | |
| 10,342,170 B2 | 7/2019 | Ikeda | |
| 10,455,749 B2 | 10/2019 | Motowaki | |
| 10,477,746 B2 | 11/2019 | Kobayashi et al. | |
| 10,660,249 B2 * | 5/2020 | Kunihiro | ................ B65H 75/02 |
| 10,743,446 B2 * | 8/2020 | Tanaka | ............... H05K 13/0419 |
| 10,918,000 B2 * | 2/2021 | Iwasaki | .................. H05K 13/02 |
| 10,993,357 B2 | 4/2021 | Taniguchi | |
| 10,993,359 B2 | 4/2021 | Taniguchi | |
| 2017/0354070 A1 | 12/2017 | Kobayashi et al. | |
| 2018/0242482 A1 | 8/2018 | Kunihiro et al. | |

(Continued)

FOREIGN PATENT DOCUMENTS

| | | |
|---|---|---|
| CN | 101518173 A | 8/2009 |
| CN | 104025732 A | 9/2014 |
| CN | 107114009 A | 8/2017 |

(Continued)

*Primary Examiner* — Paul D Kim

(74) *Attorney, Agent, or Firm* — RatnerPrestia

(57) ABSTRACT

A reel holding device includes a first reel support member that includes a first placement member that rotatably supports a first reel and a second reel support member that supports a second reel. The first reel support member is rotatable between a reference position at which a carrier tape of the first reel is supplied to the mounter, and a discharge position for discharging the first reel. By rotating the first reel support member from the reference position toward the discharge position, the first reel drops through an opening of the first placement member and is discharged. When the first reel support member returns from the discharge position to the reference position, the second reel moves through the opening and into the interior of the first placement member.

8 Claims, 18 Drawing Sheets

(56) References Cited

U.S. PATENT DOCUMENTS

2018/0303014 A1   10/2018   Taniguchi
2018/0310445 A1*  10/2018   Taniguchi .......... H05K 13/0419

FOREIGN PATENT DOCUMENTS

| | | | |
|---|---|---|---|
| CN | 108141997 | A | 6/2018 |
| CN | 108353525 | A | 7/2018 |
| CN | 108382822 | A | 8/2018 |
| EP | 3267778 | A1 | 1/2018 |
| EP | 3349558 | A1 | 7/2018 |
| JP | 2003023292 | A | 1/2003 |
| JP | 2005175200 | A | 6/2005 |
| JP | 2012079842 | A | 4/2012 |
| JP | 2016162768 | A | 9/2016 |
| JP | 2017074995 | A | 4/2017 |
| JP | 2017216379 | A | 12/2017 |
| JP | 2018032801 | A | 3/2018 |
| JP | 2018093229 | A | 6/2018 |
| JP | 2018152398 | A | 9/2018 |
| JP | WO2017109891 | A1 | 10/2018 |
| WO | 2016203627 | A1 | 12/2016 |
| WO | 2017061043 | A1 | 4/2017 |
| WO | 2017098628 | A1 | 6/2017 |
| WO | 2017109846 | A1 | 6/2017 |
| WO | 2017208287 | A1 | 12/2017 |

\* cited by examiner

REEL HOLDING DEVICE ARRANGED IN COMPONENT MOUNTING MACHINE AND ROBOT SYSTEM INCLUDING REEL HOLDING DEVICE

BACKGROUND OF THE INVENTION

1. Field of the Invention

The present invention relates to a reel holding device arranged in a component mounting machine and a robot system including the reel holding device.

2. Description of the Related Art

In the related art, a component mounting machine that continuously mounts components, such as electronic components, on a surface of a printed circuit board is known. The component mounting machine includes a mounter that arranges a component in a predetermined position on a substrate. The component is supplied to the mounter by a carrier tape in which a plurality of components are held. The components are arranged inside the carrier tape at predetermined intervals. The carrier tape is wound onto a reel and arranged in the component mounting machine. The reel is rotatably supported. When the carrier tape is supplied to the mounter, the component can be continuously supplied by rotating the reel. When supply of the carrier tape wound on one reel is completed, the reel is replaced (see, e.g., Japanese Unexamined Patent Publication No. 2018-93229 A and Japanese Unexamined Patent Publication No. 2017-74995 A).

In recent years, a component mounting machine including a device that holds a plurality of reels for supplying one component has been known (for example, see Japanese Unexamined Patent Publication No. 2016-162768 A and International Publication NO. WO 2017/098628). In such a component mounting machine, after use of a carrier tape wound on one reel is completed, a carrier tape wound on another reel can be supplied to the mounter. Furthermore, a component mounting machine is known that includes a tape feeder that automatically supplies a carrier tape of another reel to the mounter when the supply of the carrier tape of one reel is completed (see, e.g., International Publication NO. WO 2016/203627).

SUMMARY OF THE INVENTION

A component mounting machine can arrange a plurality of types of components on a surface of a substrate. In one carrier tape, one type of component is included. A plurality of reels are arranged in the component mounting machine in order to arrange the plurality of types of components on the surface of the substrate. The plurality of reels are arranged side-by-side. The carrier tape extends from the reel to a tape feeder. Accordingly, a plurality of carrier tapes are arranged in a space from the reel to the tape feeder.

The reel for which a supply of the carrier tape is completed needs to be removed from the component mounting machine and a new reel needs to be arranged in the component mounting machine. Even in the component mounting machine that includes the tape feeder that automatically supplies the carrier tape of the next reel to the mounter, a reel whose use is completed needs to be removed and a new reel needs to be arranged when the supply of the carrier tape of one reel is completed.

However, in the related art, it is necessary to remove the reel whose use is completed while avoiding the reel from coming into contact with the plurality of carrier tapes that are present in the space from the reel to the tape feeder. Further, it is necessary to arrange a new reel while avoiding the plurality of carrier tapes. That is, it is necessary to remove the reel or arrange the reel through the region between the plurality of carrier tapes that are present in the space.

For this reason, there is a problem that it is difficult to remove the reel whose use is completed or to arrange the new reel. Furthermore, there is a problem that it is difficult to replace the reel by a robot. Alternatively, there is a problem that reel replacement work takes a long time.

A reel holding device of an aspect of the present disclosure is arranged in a component mounting machine that includes a mounter that mounts a component on a surface of a substrate, and holds a reel on which a carrier tape that holds the component is wound. The reel holding device includes a first reel support member that includes a first placement member that rotatably supports a first reel, and a second reel support member that includes a second placement member that supports a second reel. The first reel support member is rotatable between a reference position which is a position at which the carrier tape of the first reel is supplied to the mounter, and a discharge position which is a position for discharging the first reel. The second placement member is arranged so that a region where the second reel is arranged and a region of the first placement member where the first reel is arranged are aligned linearly. The first placement member includes a first contact part formed on a portion that faces the second placement member when the first reel support member is arranged in the reference position. The first placement member includes a second contact part formed on a portion that faces the second placement member when the first reel support member is arranged in the discharge position. The first placement member includes an opening that is formed in a region that is sandwiched between the first contact part and the second contact part and that has a size through which the second reel can pass. When the first reel support member is arranged in the reference position, the second reel is in contact with the first contact part and is prevented from moving to the interior of the first placement member. When the first reel support member is arranged in the discharge position, the second reel is in contact with the second contact part and is prevented from moving to the interior of the first placement member. By the first reel support member rotating from the reference position toward the discharge position, the first reel drops from the first placement member through the opening and is discharged. When the first reel support member returns from the discharge position to the reference position, the second reel moves through the opening and into the interior of the first placement member.

A robot system of one aspect of the present disclosure includes a component mounting machine that includes the above-described reel holding device. The robot system includes a work tool that includes a first hand configured to operate the first reel support member and a second hand configured to operate the carrier tape, and a robot that changes a position and an orientation of the work tool. The robot system includes a robot controller that controls the robot and the work tool. The component mounting machine includes a tape feeder that supplies a carrier tape to the mounter. After the supply of the carrier tape of the first reel is completed, the first hand grips the first reel support member, and the robot changes the position and the orientation so that the first reel support member rotates from the reference position to the discharge position. Further, the robot changes the position and the orientation so that the first reel support member returns from the discharge position to the reference position.

DETAILED DESCRIPTION

Referring to FIG. 1 to FIG. 21, a reel holding device, a component mounting machine that includes a reel holding device, and a robot system that includes the component mounting machine and a robot of an embodiment will be described.

Figure 1:
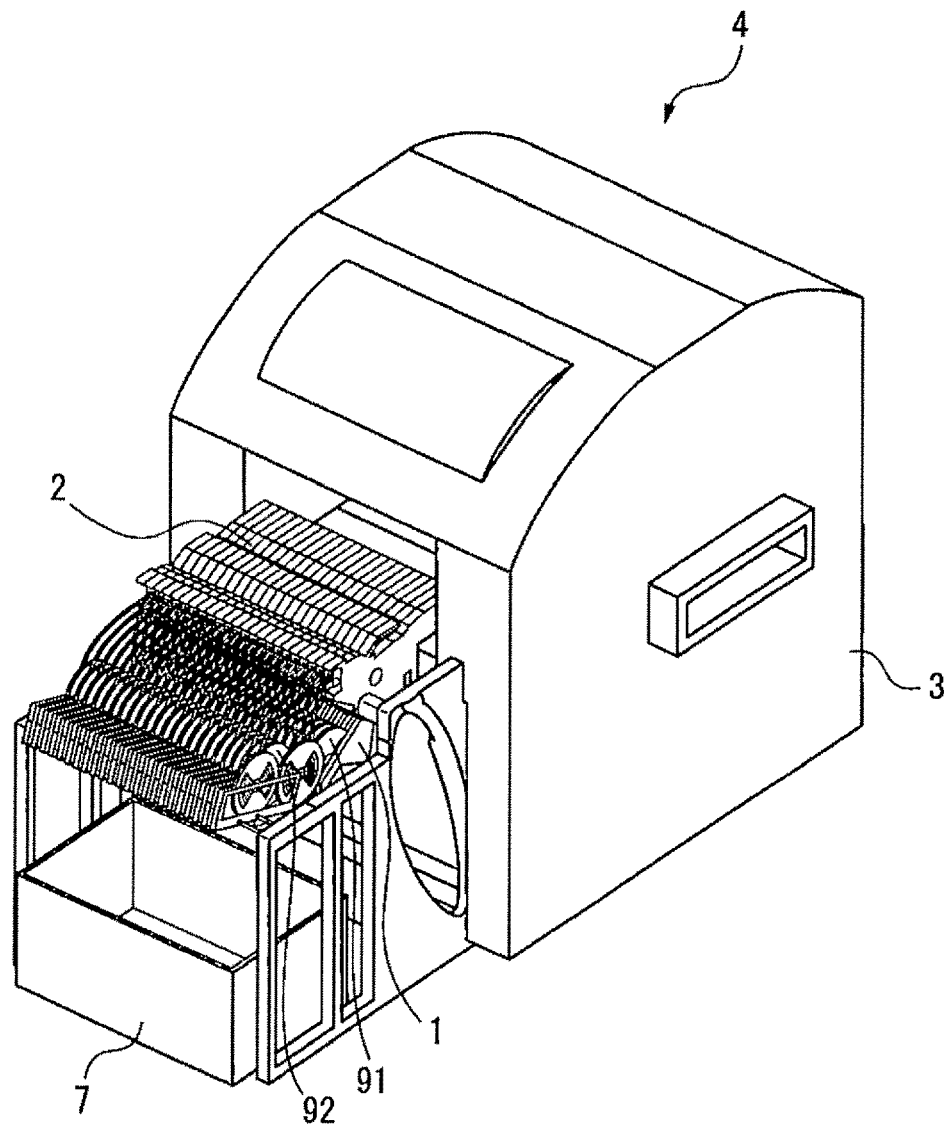
FIG. 1 is a perspective view of a component mounting machine in an embodiment.

FIG. 1 illustrates a perspective view of a component mounting machine of a present embodiment. The component mounting machine 4 of the present embodiment arranges a plurality of types of components on a surface of a substrate such as a printed circuit board. The component mounting machine 4 is also referred to as a surface mounting machine. An electronic component can be exemplified as a component arranged on the substrate. The component mounting machine 4, for example, arranges the component on a substrate together with solder paste or the like. In the next step, the solder paste is heated and the component can be fixed to the substrate.

The component mounting machine 4 includes a mounter 3 that includes a machine that grips the component and arranges the component onto the surface of the substrate. Inside the mounter 3, for example, a robot for gripping and moving parts is arranged. The robot includes, for example, a head that grips the component by a method of suction or the like. The head is formed so as to move in an X-axis direction and a Y-axis direction with respect to the surface of the substrate. The robot arranges the component in a predetermined position of the substrate. The mounter is not limited to this configuration, and any mechanism that arranges the component on the surface of the substrate can be adopted. For example, the mounter may be formed so that the component is arranged on the substrate while the rotary head that grips the component is rotating, and the substrate moves in the X-axis direction and the Y-axis direction.

The component mounting machine 4 includes a reel holding device 1 that holds the reel on which the carrier tape is wound, and a tape feeder 2 that supplies the carrier tape from the reel to the mounter 3. The reel holding device 1 of the present embodiment is formed so as to hold a plurality of reels 91, 92. The component mounting machine 4 includes a collection box 7 configured to collect the reel for which the supply of carrier tape is completed. In the present embodiment, the reel for which the supply of the carrier tape is completed drops from the reel holding device 1 and is collected in the collection box 7.

Figure 2:
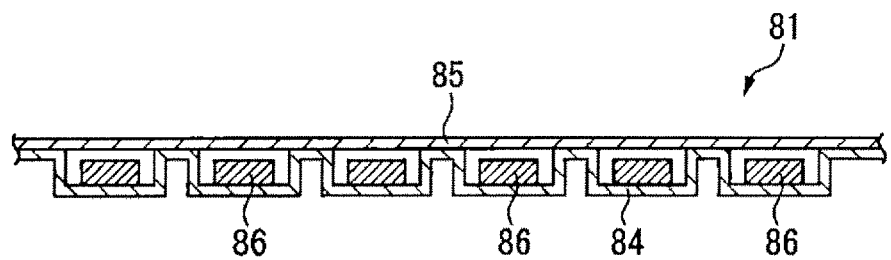
FIG. 2 is a schematic cross-sectional view of a carrier tape in the embodiment.

FIG. 2 illustrates a schematic cross-sectional view of the carrier tape of the present embodiment. The carrier tape 81 is formed in a tape shape. The carrier tape 81 includes a base tape 84 that includes a recess in which an electronic component 86 is arranged, and a cover tape 85 that covers the base tape 84. The cover tape 85 is formed so as to be able to be peeled off from the base tape 84. The electronic component 86 is arranged in a space between the recess of the base tape 84 and the cover tape 85. The electronic component 86 is arranged at a regular interval along the extending direction of the carrier tape 81. The carrier tape is not limited to this configuration, and any tape that can hold a plurality of components can be adopted.

Figure 3:
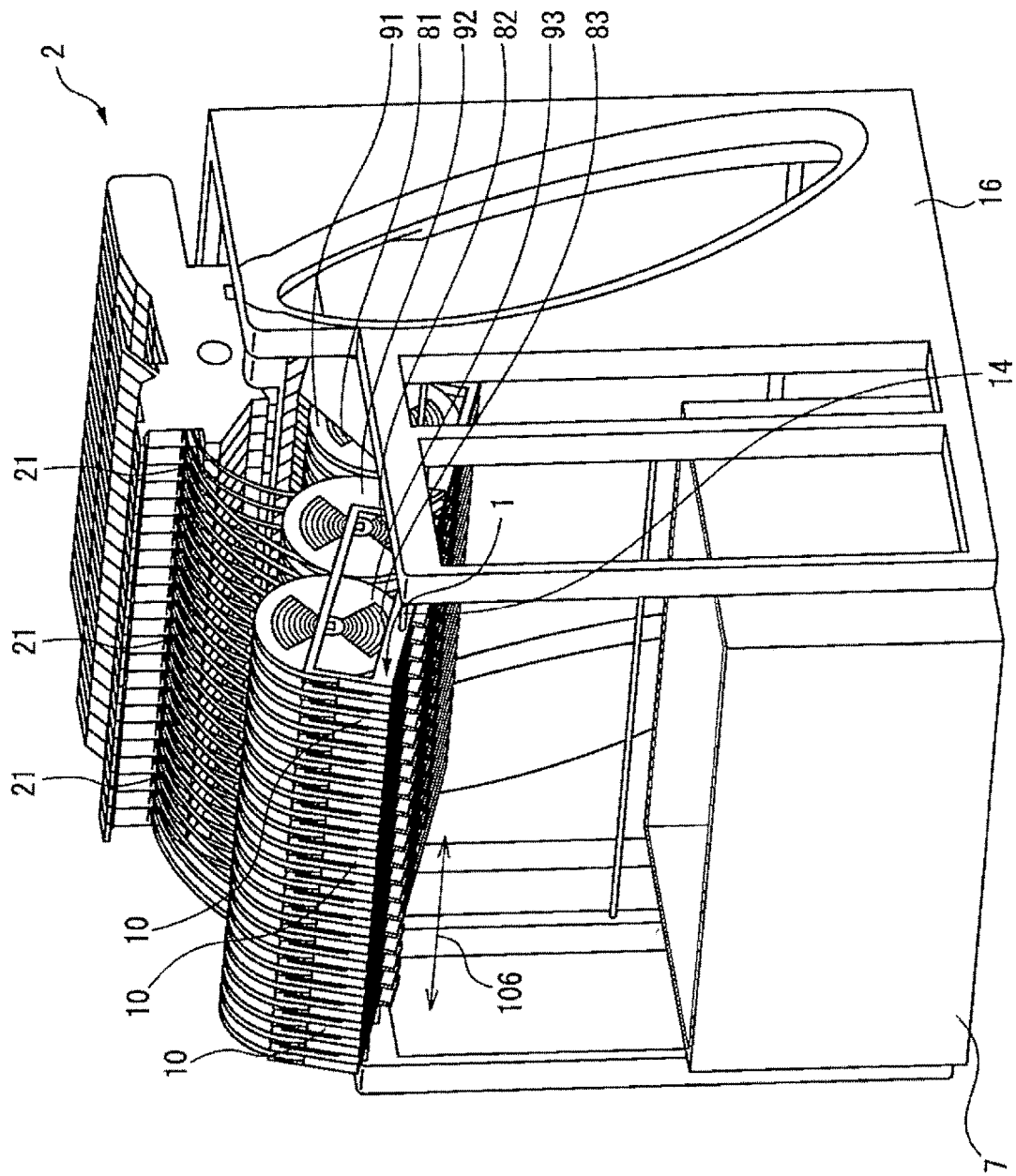
FIG. 3 is a perspective view of a reel holding device and a tape feeder in the embodiment.

FIG. 3 illustrates an enlarged perspective view of the tape feeder and the reel holding device of the present embodiment. The reel holding device 1 includes a frame member 16 placed on a floor surface and a reel holding part 10 supported on the frame member 16. A plurality of reels 91, 92, 93 are held in one reel holding part 10. In the example illustrated in FIG. 3, a first reel 91, a second reel 92, and a third reel 93 are held in the reel holding part 10. A first carrier tape 81 is wound on the first reel 91. A second carrier tape 82 is wound on the second reel 92. A third carrier tape 83 is wound on the third reel 93. The reel holding device 1 includes a plurality of reel holding parts 10. The plurality of reel holding parts 10 are arranged side by side in a width direction of the component mounting machine 4, as indicated by an arrow 106.

One type of the electronic component is held in one carrier tape. The carrier tapes 81, 82, 83 in which the same electronic components 86 are held are wound on the reels 91, 92, 93 which are arranged on one reel holding part 10 of the present embodiment. In the present embodiment, the plurality of reels 91, 92, 93 have the same size as each other, but are not limited to this configuration. The plurality of reels 91, 92, 93 may differ in size from each other.

A plurality of reels are arranged in the component mounting machine 4 in accordance with the number of components that are mounted on the substrate. The reel holding device 1 is formed so as to be able to hold the plurality of reels which hold different types of carrier tapes. In the component mounting machine 4, the plurality of reel holding parts 10 are arranged in accordance with the number of types of components that are mounted on the substrate. In the example illustrated in FIG. 3, the carrier tapes 81, 82, 83 that include the electronic components of different types from each other are wound on the reels 91, 92, 93 in respective reel holding parts 10.

Inside the tape feeder 2 of the present embodiment, the cover tape 85 is peeled off from the base tape 84. The mounter 3 can remove the electronic component 86 from the base tape 84 and arrange the electronic component 86 on the surface of the substrate.

Figure 4:
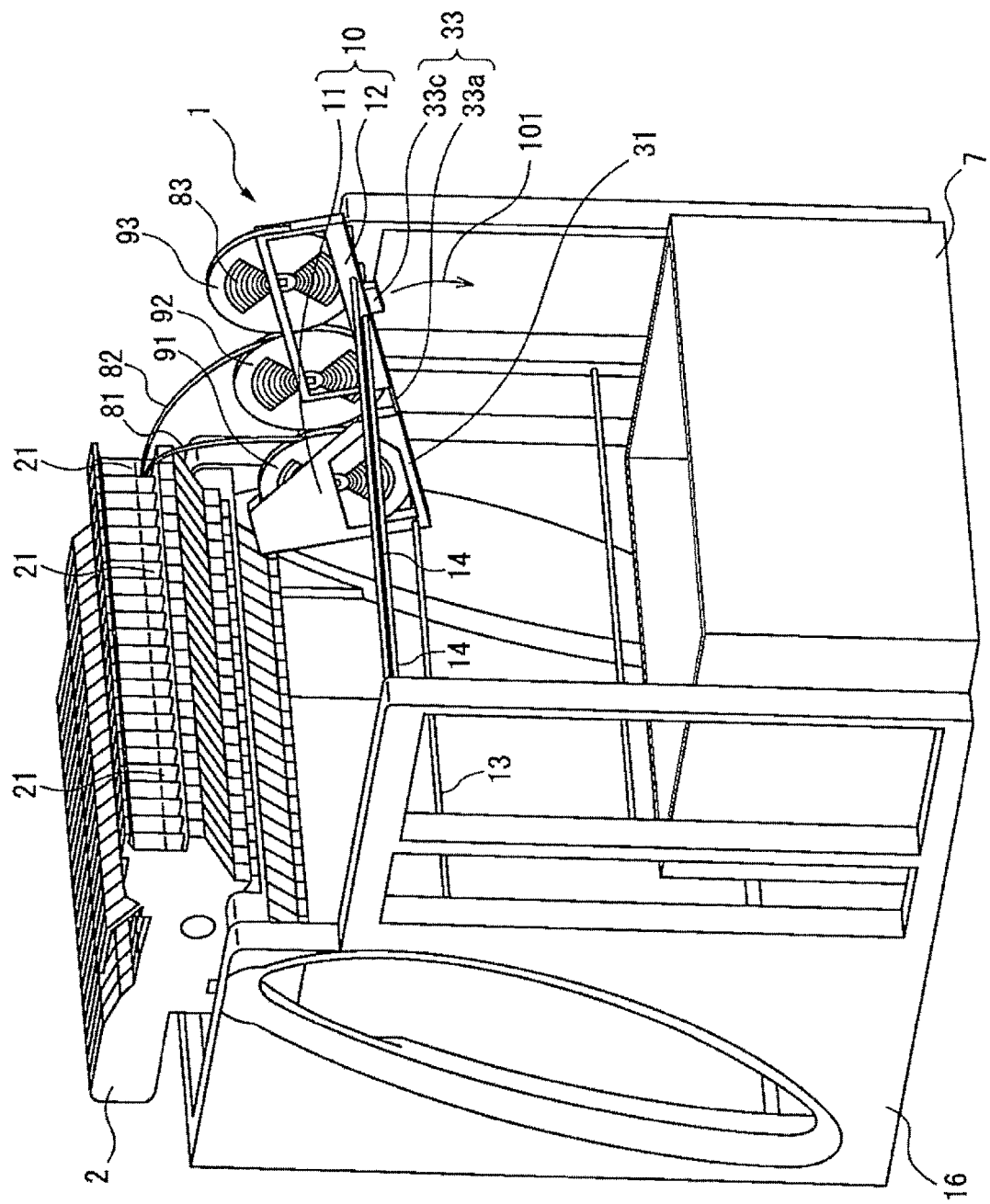
FIG. 4 is a first perspective view of the reel holding device and the tape feeder showing one reel holding part in the embodiment.
Figure 5:
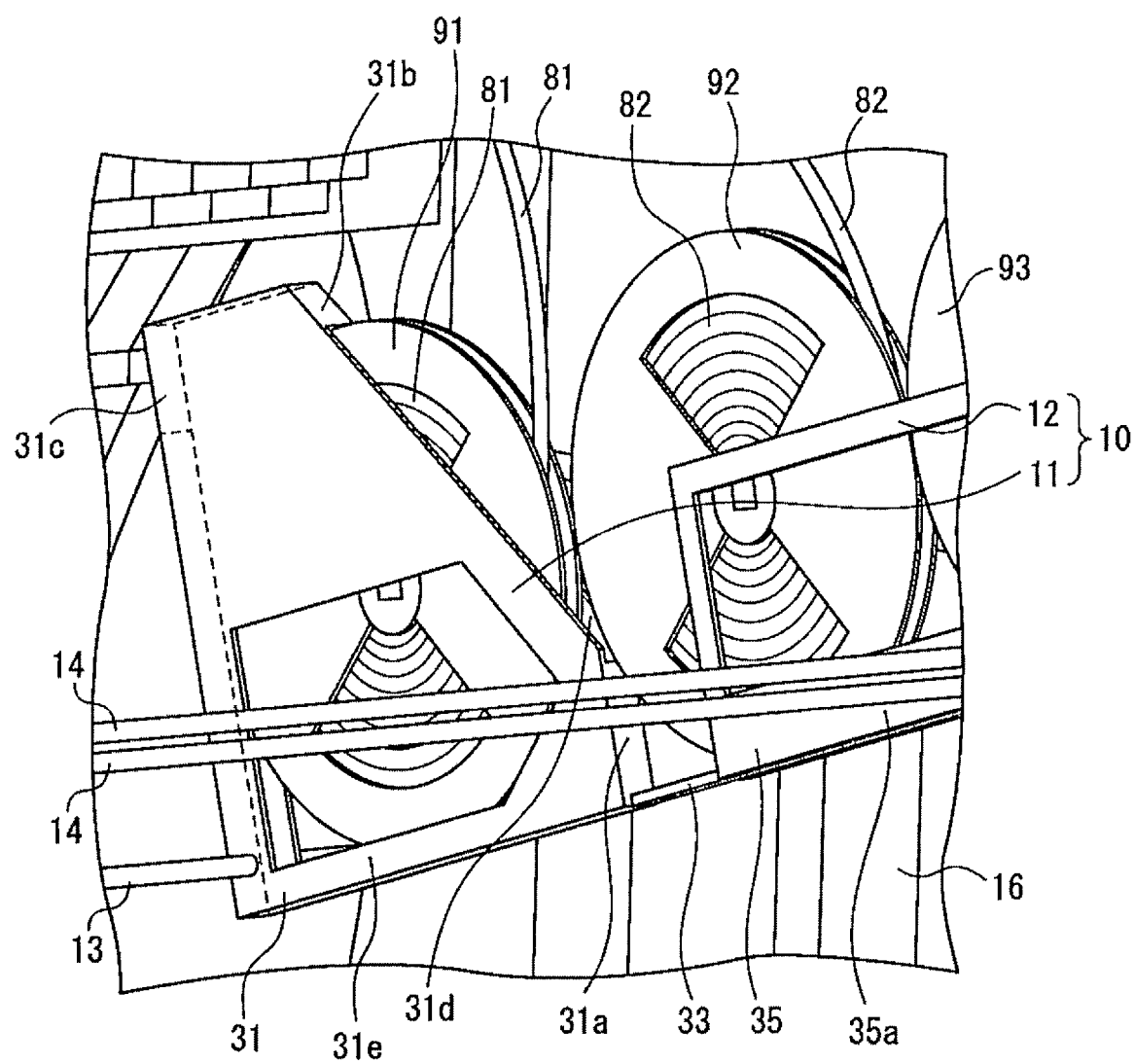
FIG. 5 is a first enlarged perspective view of the reel holding part in the embodiment.

FIG. 4 shows a first perspective view of a reel holding device and a tape feeder, illustrating one reel holding part among the plurality of reel holding parts. FIG. 5 illustrates a first enlarged perspective view of the reel holding part. Referring to FIG. 4 and FIG. 5, the first reel 91, the second reel 92, and the third reel 93 are arranged on one reel holding part 10. In the tape feeder 2 of the present embodiment, the first carrier tape 81 and the second carrier tape 82 that hold the same electronic components 86 are inserted into a supply port 21 of the tape feeder 2. The first carrier tape 81 of the first reel 91 that is arranged on the closest position to the tape feeder 2 is supplied to the mounter 3 by the tape feeder 2.

The second carrier tape 82 of the second reel 92 is used so as to follow the first carrier tape 81. The carrier tape 82 is inserted into the supply port 21 over the upper side of the carrier tape 81. The tape feeder 2 has a function of holding the carrier tape 82 in the interior without being fed to the mounter 3. Further, the third reel 93, which is used after the use of the first reel 91 and the second reel 92 is completed, is arranged on the reel holding part 10.

Figure 6:
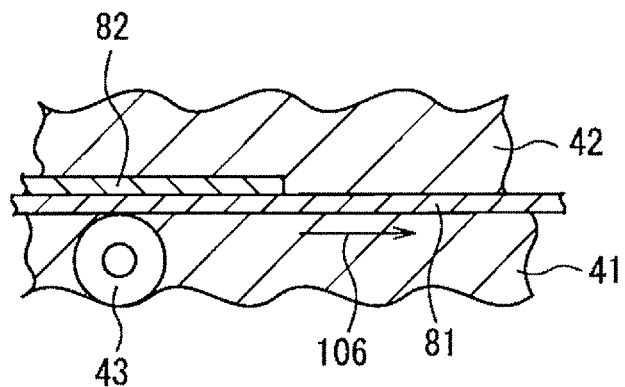
FIG. 6 is an enlarged schematic cross-sectional view for illustrating a first step of supplying a new carrier tape in the tape feeder in the embodiment.

FIG. 6 illustrates a first schematic cross-sectional view of the tape feeder of the present embodiment. The tape feeder 2 of the present embodiment has a mechanism that supplies the second carrier tape 82 to the mounter 3 so as to follow the first carrier tape 81 when the supply of the first carrier tape 81 of the first reel 91 is completed. That is, the tape feeder 2 automatically supplies the second carrier tape 82 to the mounter 3 when the use of the first carrier tape 81 is completed.

The tape feeder 2 includes a guide member 41 on the lower side and a guide member 42 on the upper side. A passage of the first carrier tape 81 is formed by a space between the guide member 41 and the guide member 42. The first carrier tape 81 is supplied to the mounter 3 in the direction indicated by the arrow 106, by rotating the sprocket 43. A passage in which the second carrier tape 82 is arranged is formed on the upper side of the passage of the first carrier tape 81. The end of the passage in which second carrier tape 82 is arranged is closed. During a period in which the first carrier tape 81 is being supplied, the second carrier tape 82 is prevented from moving and is held by the tape feeder 2.

Figure 7:
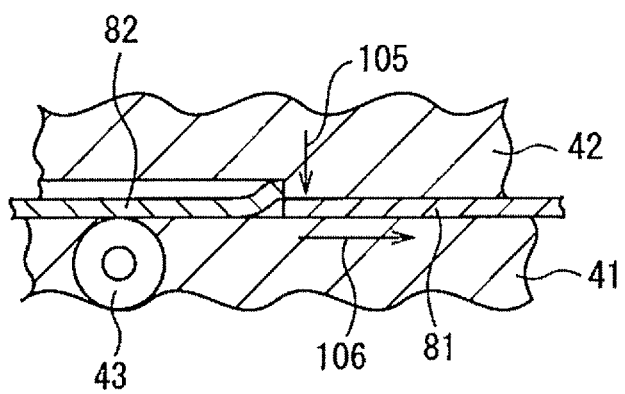
FIG. 7 is an enlarged schematic cross-sectional view for illustrating a second step of supplying the new carrier tape in the tape feeder.
Figure 8:
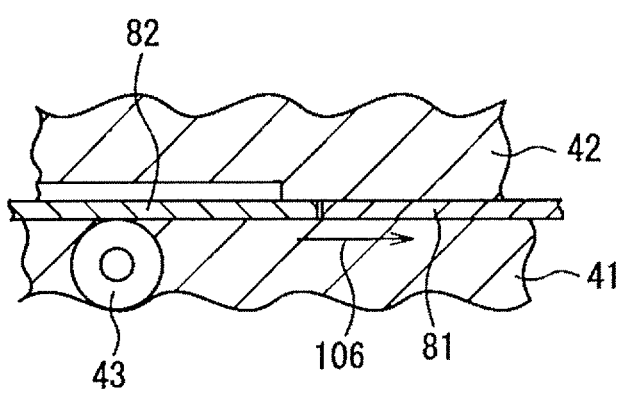
FIG. 8 is an enlarged schematic cross-sectional view for illustrating a third step of supplying the new carrier tape in the tape feeder.

FIG. 7 illustrates a second schematic cross-sectional view of the tape feeder of the present embodiment. FIG. 8 illustrates a third schematic cross-sectional view of the tape feeder of the present embodiment. Referring to FIG. 7 and FIG. 8, when the use of the first carrier tape 81 is completed, the second carrier tape 82 drops due to gravity into a passage configured to feed the carrier tape to the mounter 3, as indicated by the arrow 105. The leading end of the second carrier tape 82 is arranged so as to follow the trailing end of the first carrier tape 81 in a passage configured to feed the carrier tape to the mounter 3. By rotating the sprocket 43, the second carrier tape 82 can be supplied to the mounter 3 in the direction indicated by the arrow 106.

As described above, the tape feeder 2 of the present embodiment can automatically supply the next carrier tape when the use of one carrier tape is completed. The tape feeder as such is also referred to as auto loading feeder.

Next, during a period in which the second carrier tape 82 is being supplied, by inserting the third carrier tape 83 that is wound on the third reel 93 into the supply port 21 of the tape feeder 2, the third carrier tape 83 can be arranged on the upper side of the second carrier tape 82. That is, the carrier tapes can be arranged in the state similar to the state illustrated in FIG. 6. By repeating this operation, even when the use of the carrier tape wound on one reel is completed, the component can be continuously supplied to the mounter 3 without stopping the mounter 3. That is, it is not necessary to stop the mounter 3 each time when the reel is replaced, and the mounter 3 can continuously mount the component.

Next, the operation of replacing the reel in the reel holding device 1 will be described. Referring to FIG. 4 and FIG. 5, the reel holding part 10 includes a first reel support member 11 and a second reel support member 12. The collection box 7 is arranged on the lower side of the first reel support member 11. A first reel 91 that supplies the carrier tape 81 to the mounter 3 is placed on the first reel support member 11. A second reel 92 on which the second carrier tape 82 is wound is placed on the second reel support member 12. Furthermore, the third reel 93 that is used so as to follow the second reel 92 is placed on the second reel support member 12.

The first reel support member 11 includes a first placement member 31 on which the first reel 91 is placed and supports the first reel 91. The first placement member 31 rotatably supports the first reel 91. The first placement member 31 includes two side plates 31e that are arranged so as to sandwich the reel 91, and a base plate which is arranged in the bottom part of the side plate 31e and on which the reel 91 is placed. The side plate 31e of the present embodiment is formed so that the planar shape is a trapezoid. The first reel 91 is contained in a space surrounded by the two side plates 31e and the base plate. Note that a roller may be arranged on the bottom part of the first placement member 31 so that the first reel 91 rotates smoothly. The first placement member 31 includes an opening 31d formed on a side that faces the second placement member 35 of the second reel support member 12. The opening 31d has a size through which the second reel 92 can pass.

The first reel support member 11 is supported by a support rod 13. The support rod 13 is supported by the frame member 16. The first reel support member 11 is formed so as to rotate about the support rod 13. The first reel support member 11 is formed so as to be rotatable between a reference position, which is a position when the first carrier tape 81 is supplied to the mounter 3, and a discharge position that rotates from the reference position toward the lower side. The discharge position is a position where the first reel 91 is discharged toward the collection box 7. The first reel support member 11 illustrated in FIG. 4 and FIG. 5 is arranged at the reference position.

The first placement member 31 is arranged inclined with respect to the horizontal direction such that when the first reel support member 11 is arranged in the reference position, the height of the base surface is gradually lowered toward the tape feeder 2. That is, the first reel 91 is arranged inclined so as to roll toward the tape feeder 2. The first placement member 31 includes a third contact part 31c that supports the first reel 91 such that, when the first reel support member 11 is arranged in the reference position, the first reel 91 does not drop from the first placement member 31. The contact part 31c of the present embodiment is formed by the contact member that has a plate shape. The contact part 31c is constituted by a wall of the first placement member 31.

The contact part 31c of the present embodiment is formed on the upper part of the first placement member 31, but is not limited to this configuration. The contact part 31c may be formed on the lower part of the first placement member 31. Alternatively, the contact part 31c may be formed from the upper part to the lower part of the first placement member 31.

The second reel support member 12 includes a second placement member 35. The second placement member 35 includes two side plates 35a that are formed so as to sandwich the reels 92, 93, and a base plate that is arranged on the bottom part of the side plate 35a and on which the second reel 92 and the third reel 93 are placed. The reel 92, 93 is arranged in a space surrounded by the two side plates 35a and the base plate. The second reel support member 12 is supported by a fixed rod 14.

The second reel support member 12 is fixed to the frame member 16 via the fixed bar 14 without rotating.

The second placement member 35 is arranged inclined with respect to the horizontal direction so that the reels 92, 93 that are placed on the second placement member 35 roll toward the first placement member 31. That is, the second placement member 35 is arranged on a position so that the position of the end portion on the side toward the tape feeder 2 is lower than the position of the end portion on the opposite side to the side toward the tape feeder 2.

The second placement member 35 is arranged so that the region where the second reel 92 is arranged and the region where the first reel 91 of the first placement member 31 is arranged are aligned linearly. The second placement member 35 is arranged in line with the first placement member 31 such that the second reel 92 moves from the second placement member 35 toward the first placement member 31 as described below. In the present embodiment, the second placement member 35 is arranged so that the side plates 31e of the first placement member 31 and the side plates 35a of the second placement member 35 are arranged in the same plane.

The first placement member 31 includes a first contact part 31a formed on a portion facing the second placement member 35 when the first reel support member 11 is arranged in the reference position. The first contact part 31a of the present embodiment is a contact member formed in a plate shape. The first contact part 31a is constituted by the wall of the first placement member 31. A force that moves toward the first placement member 31 applies on the second reel 92. By contacting the second reel 92 with the first contact part 31, a movement of the second reel 92 toward the interior of the first placement member 31 is prevented. The movement of the third reel 93 is prevented by contacting the second reel 92.

In a state where the first reel support member 11 is arranged at the reference position, the tape feeder 2 supplies the first carrier tape 81 to the mounter 3. When the supply of all components included in the first carrier tape 81 is completed, the tape feeder 2 switches to the second carrier tape 82 of the second reel 92. The first reel 91 becomes an empty reel on which the first carrier tape 81 is not wound. For this, the operation of discharging the first reel 91 is performed.

Figure 9:
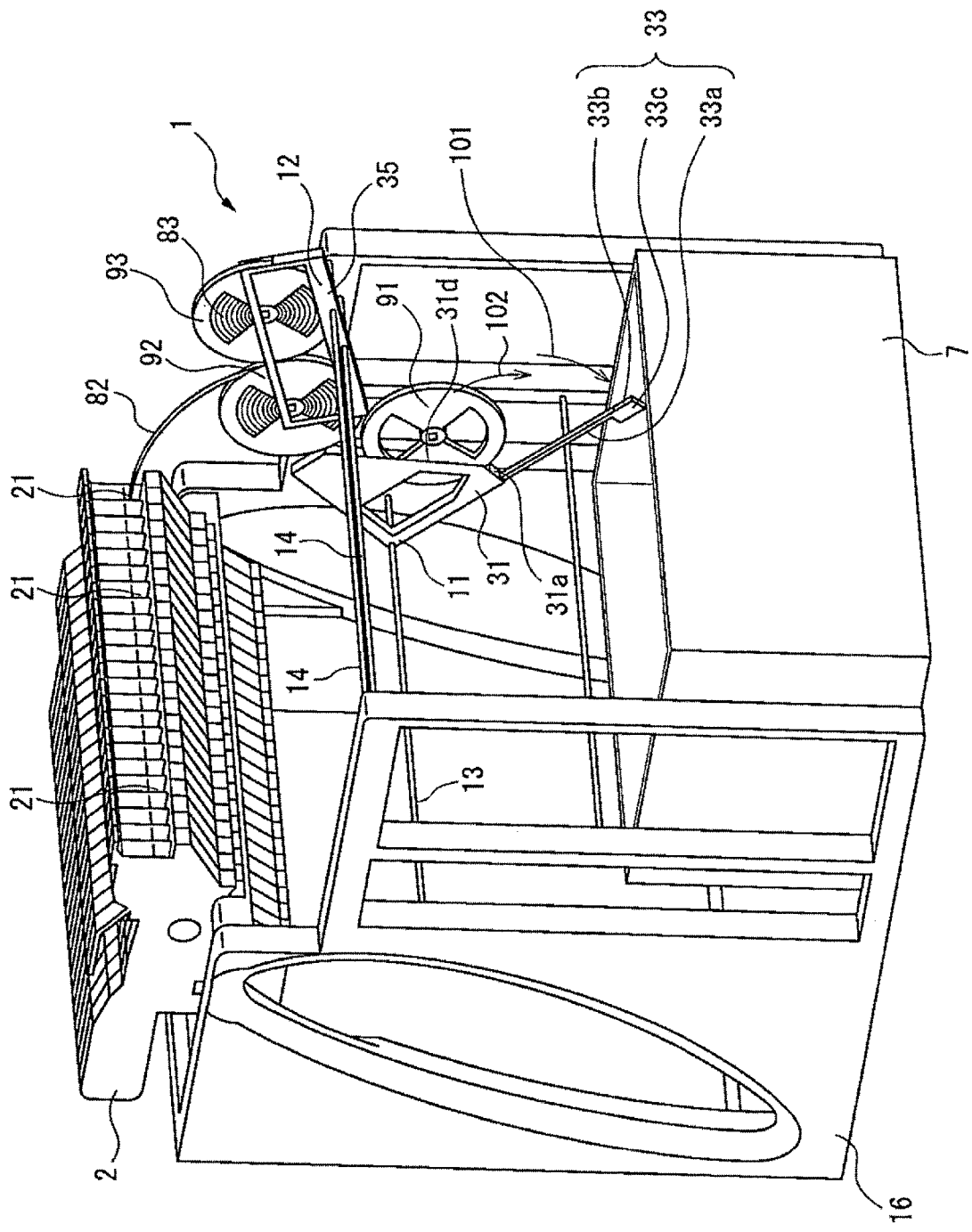
FIG. 9 is a second perspective view of a reel holding device and a tape feeder showing one reel holding part.
Figure 10:
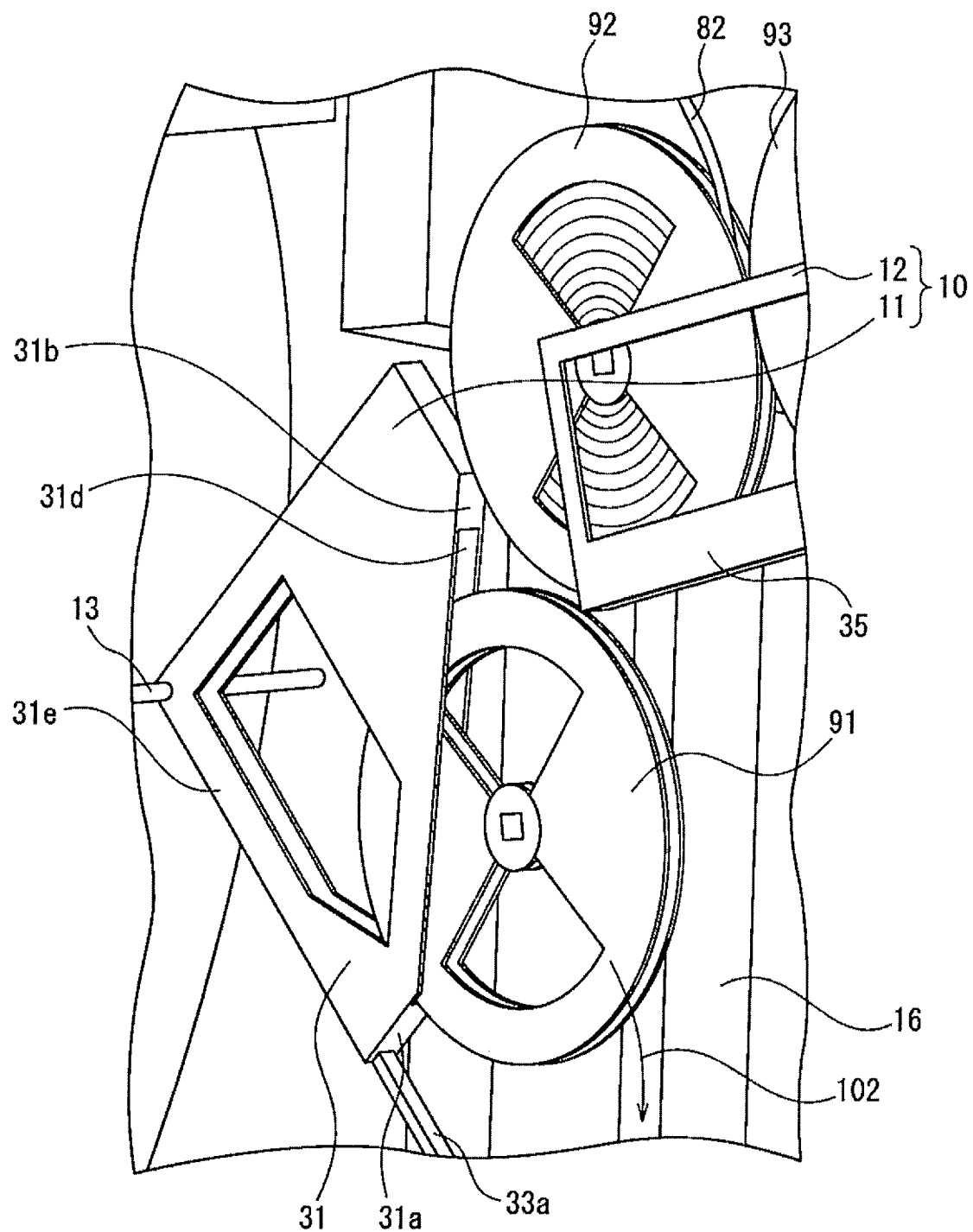
FIG. 10 is a second enlarged perspective view of the reel holding part.

FIG. 9 shows a second perspective view of the reel holding device illustrating one reel holding part and the tape feeder. FIG. 10 illustrates a second enlarged perspective view of the reel holding part. Referring to FIG. 9 and FIG. 10, the first reel support member 11 includes an operation part 33 configured by an operation member formed so as to extend from the first placement member 31 along the second placement member 35. The operation part 33 includes a rod-shaped part 33a that is formed from a rod-shaped member that is formed so as to extend from the first placement member 31 along the bottom surface of the second placement member 35.

The operation part 33 includes a fixing part configured by a fixing member that fixes the rod-shaped part 33a to the second placement member 35. The fixing part of the present embodiment includes a magnet 33b. The magnet 33b is arranged at the end of the rod-shaped part 33a. When the first reel support member 11 is arranged in the reference position, the magnet 33b is attracted to the bottom surface of the second placement member 35 so that the first reel support member 11 is fixed in the reference position. The fixing part is not limited to this configuration, and any mechanism that fixes the first reel support member 11 to the second reel support member 12 so that the first reel support member 11 does not rotate can be adopted. Further, the operation part 33 includes a knob part 33c that is constituted by a knob member for an operator to grip the operation part 33. The knob part 33c is arranged at the end of the rod-shaped part 33a.

When the supply of the first carrier tape 81 of the first reel 91 is completed, the operator moves the knob part 33c downward, as indicated by an arrow 101. The first reel support member 11 rotates from the reference position toward the discharge position. By rotating the first reel support member 11, the opening 31d that is formed in the first placement member 31 moves downward. As a result, the first reel 91 for which the supply of the first carrier tape 81 is completed drops from the opening 31d. In this manner, the position of the first reel support member 11 that rotates until the first reel 91 drops from the opening 31d corresponds to the discharge position. The first reel 91 drops to the collection box 7, as indicated by an arrow 102.

The first placement member 31 has a second contact part 31b formed on a portion facing the second placement member 35 when the first reel support member 11 is arranged in the discharge position. The second contact part 31b of the present embodiment is formed by a contact member that has a plate shape. The second contact part 31b is constituted by a wall of the first placement member 31. The second contact part 31b is formed in the top part of the first placement member 31 when the first reel support member is arranged in the reference position. The opening 31d is formed in a region that is sandwiched between the first contact part 31a and the second contact part 31b.

By rotating of the first reel support member 11, a prevention of the movement of the second reel 92 by the first contact portion 31a is released. The second reel 92 contacts the first reel 91 so that the movement toward the first reel support member 11 is prevented. In addition, as illustrated in FIG. 10, by rotating of the first reel support member 11, the second reel 92 comes into contact with the second contact part 31b and the movement of the second reel 92 into the interior of the first placement member 31 is prevented. In this way, the first reel 91 can be dropped into the collection box 7 while preventing movement of the second reel 92.

Figure 11:
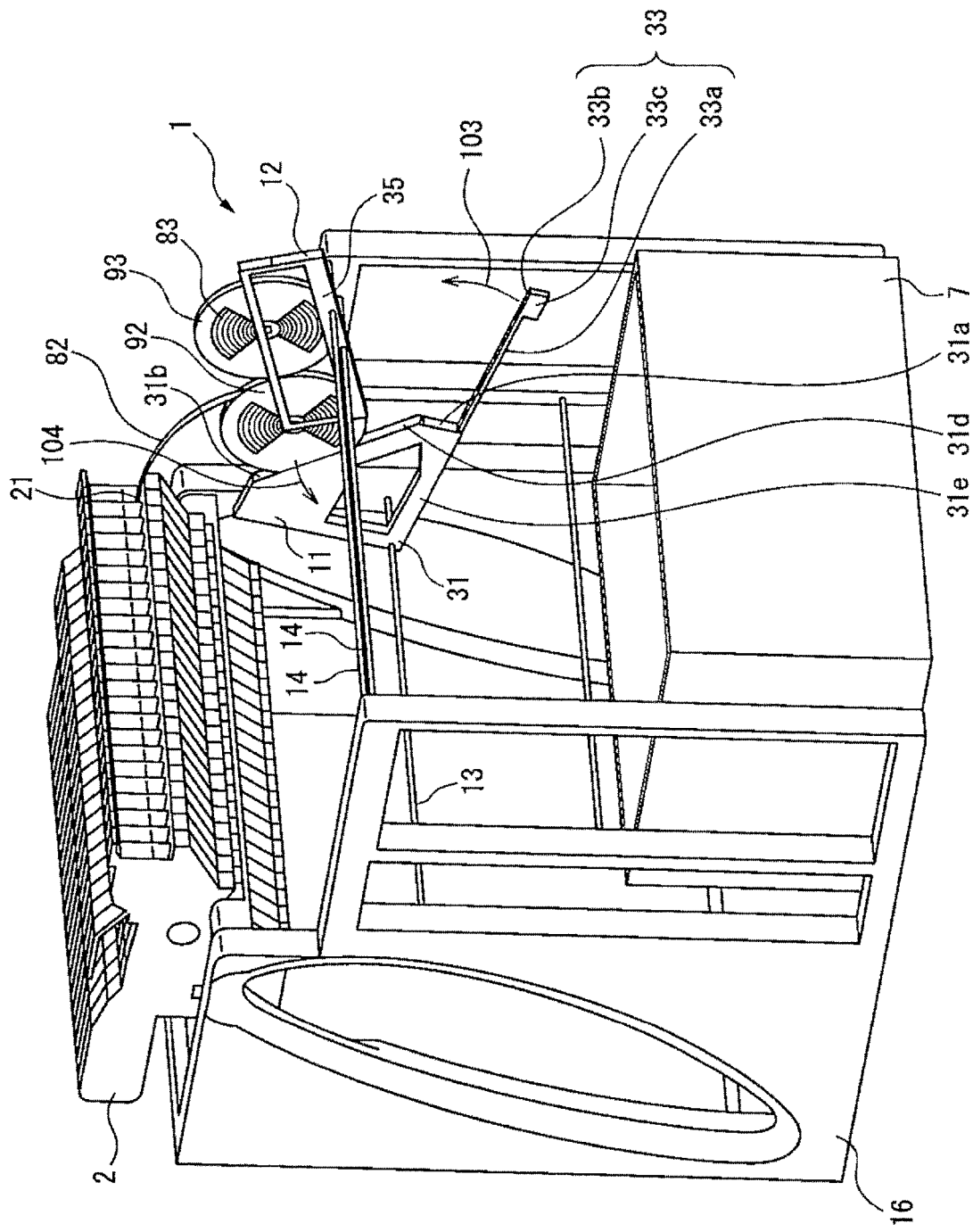
FIG. 11 is a third perspective view of the reel holding device and the tape feeder showing one reel holding part.
Figure 12:
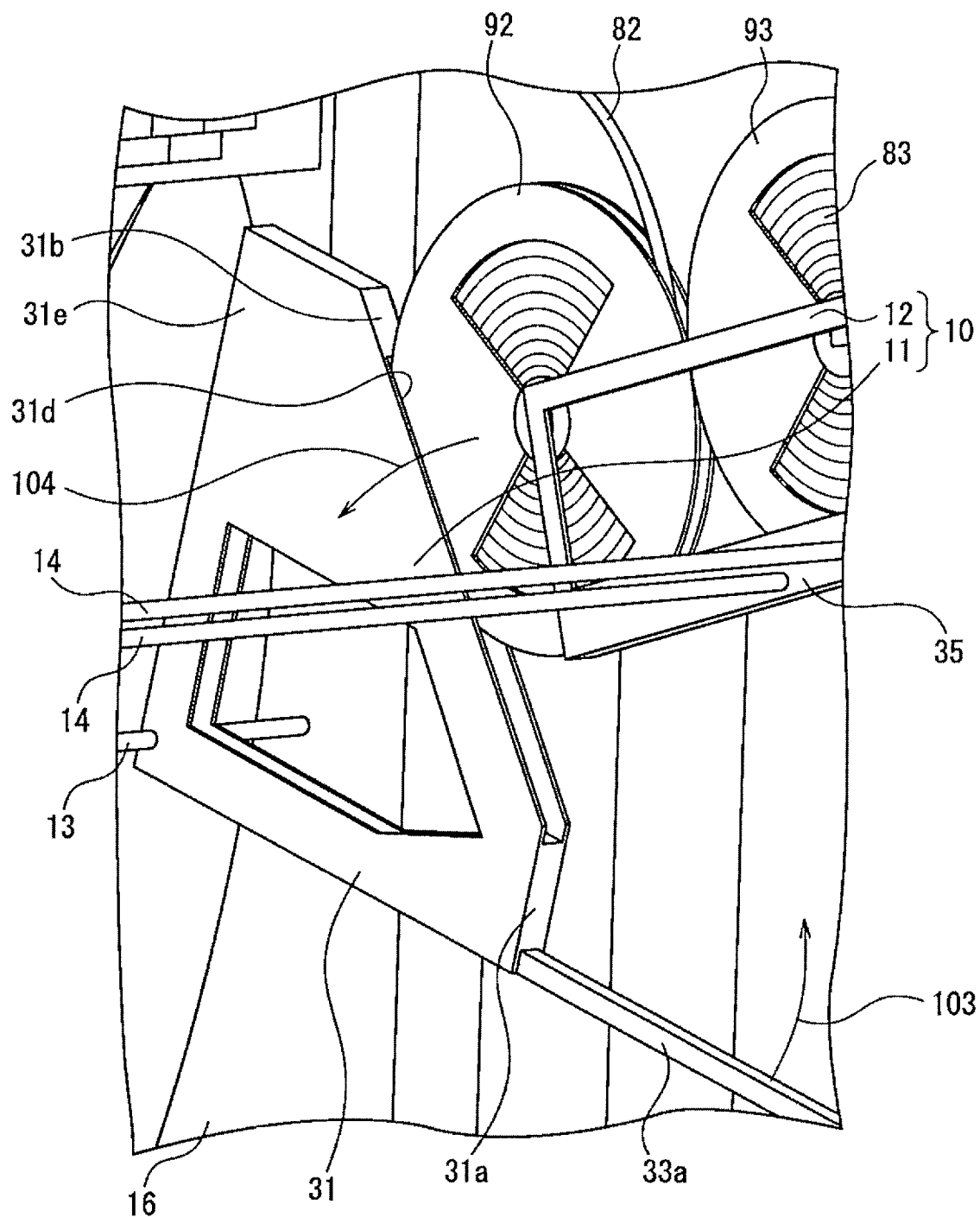
FIG. 12 is a third enlarged perspective view of the reel holding part.

FIG. 11 shows a third perspective view of the reel holding device illustrating one reel holding part and the tape feeder. FIG. 12 illustrates a third enlarged perspective view of the reel holding part. Referring to FIG. 11 and FIG. 12, after the first reel 91 is discharged, the operator moves the knob part 33c upward, as indicated by an arrow 103. The first reel support member 11 rotates from the discharge position toward the reference position. At this time, the second reel 92 is released from contacting with the second contact part 31b of the first placement member 31. The second reel 92 moves through the opening 31d and into the interior of the first placement member 31 due to the effect of gravity, as indicated by an arrow 104.

Further, by lifting the knob part 33c, in the state where the second reel 92 is contained in the interior of the first placement member 31, the operator can return the first reel support member 11 to the reference position. The magnet 33b is attracted to the bottom surface of the second placement member 35, whereby the first reel support member 11 is fixed in the reference position. In this way, the empty reel can be discharged and the next reel to be used can be arranged on the first placement member 31. After this, the operator inserts the third carrier tape 83 of the third reel 93 into the supply port 21 of the tape feeder 2. Furthermore, by placing a new fourth reel on the second placement member 35, the same state as that illustrated in FIG. 4 and FIG. 5 is achieved.

In the present embodiment, the operation of discharging the first reel 91 and the operation of inserting the third carrier tape 83 of the third reel 93 into the supply port 21 of the tape feeder 2 can be performed while continuing to supply the second carrier tape 82 of the second reel 92. The reel can be replaced while performing the operation of mounting the component in the mounter 3. In the component mounting machine 4 of the present embodiment, the reel can be replaced without stopping the mounting of the components.

Note that the mounter 3 may be stopped when performing the operation of discharging the reel for which the supply of the carrier tape is completed and the operation of inserting the carrier tape of the next reel to be used into the supply port of the tape feeder.

In the reel holding device of the present embodiment, by rotating the first reel support member, the reel for which the supply of the carrier tape is completed can be discharged. Also, a new reel can be arranged at the end portion of the second reel support member. For this reason, when replacing the reel, it is not necessary to remove the reel or arrange the reel through the plurality carrier tapes that extend from the reel toward the mounter, and reel can be easily replaced.

The second placement member 35 of the present embodiment is arranged to be inclined so that the second reel 92 rolls toward the first placement member 31. By adopting this configuration, by using the effect of gravity, the second reel 92 can move into the interior of the first placement member 31 when the first reel support member 11 returns from the discharge position to the reference position. The mechanism for moving the second reel toward the first placement member is not limited to this configuration, and any mechanism can be adopted. For example, an elastic member such as a spring may bias the second reel toward the first placement member.

The first reel support member 11 of the present embodiment includes the operation part 33 formed so as to extend from the first placement member 31 toward the second placement member 35. The operation part 33 includes a rod-shaped part 33a that is formed so as to extend from the first placement member 31 along the bottom surface of the second placement member 35, and a fixing part that fixes the rod-shaped part 33a to the second placement member 35. By adopting this configuration, the end of the rod-shaped part 33a can be arranged near a position where the operator stands. The operator can easily rotate the first reel support member 11 by operating the rod-shaped part.

In addition, the tape feeder 2 of the present embodiment has a mechanism that supplies the second carrier tape 82 to the mounter 3 so as to follow the first carrier tape 81 when the supply of the carrier tape 81 of the first reel 91 is completed. By adopting this configuration, the carrier tape whose use is completed can be replaced with a new carrier tape without stopping the mounter 3. The mounter 3 can continuously supply components and mount the components.

The tape feeder may not have a function of automatically supplying the carrier tape. In this case, the operator can perform the operation of stopping the mounter and connecting the leading end of the new carrier tape to the trailing end of the carrier tape whose use is completed.

In the above embodiment, the operator performs the replacement of the reel, but the embodiment is not limited to this. By adopting the reel holding device of the present embodiment, the operation by the operator can be performed by a robot. Next, a robot system in which the robot exchanges reels will be described.

Figure 13:
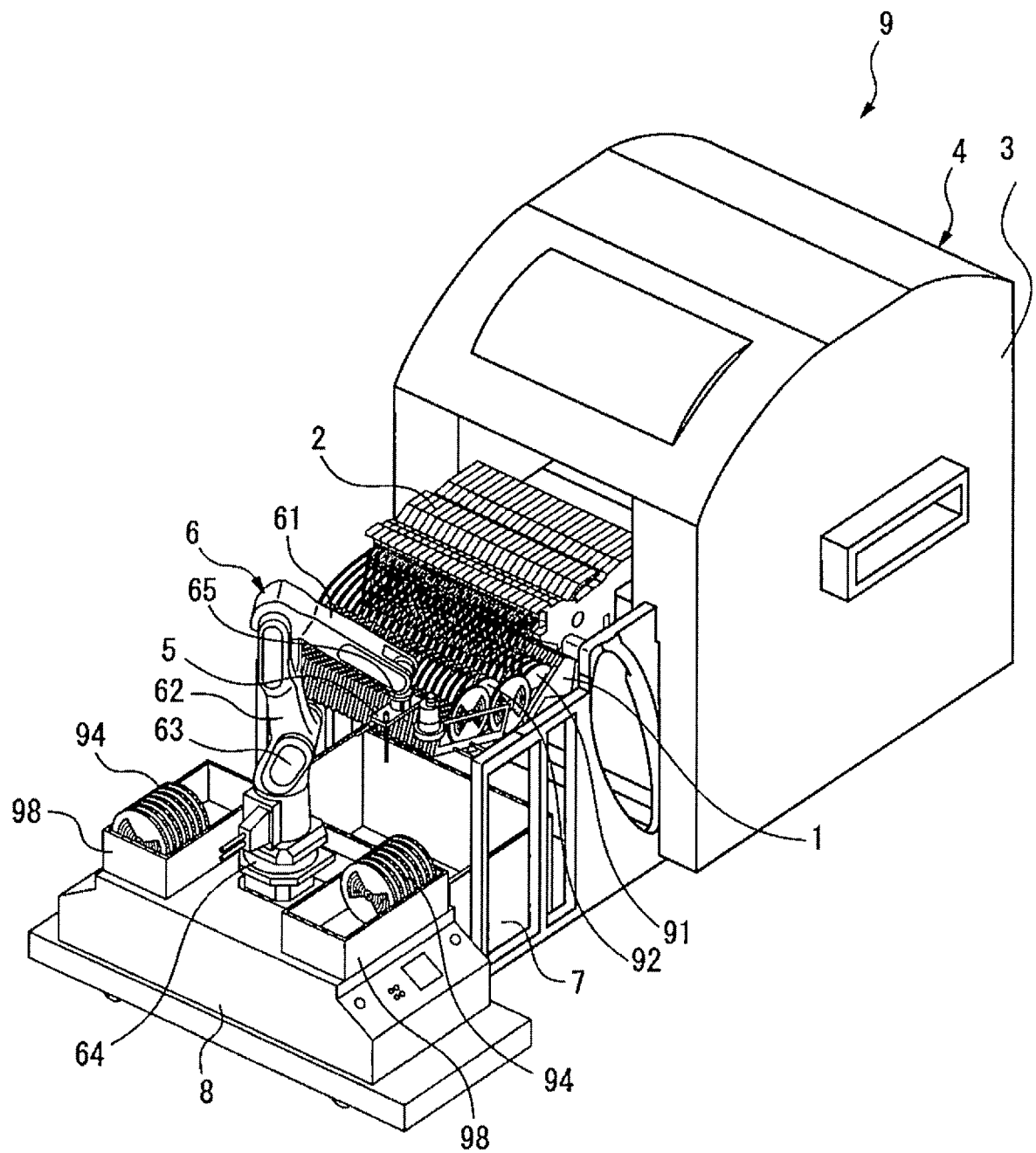
FIG. 13 is a perspective view of a robot system of an embodiment.

FIG. 13 illustrates a perspective view of the robot system of the present embodiment. A robot system 9 includes the above-described component mounting machine 4, a robot 6, and a work tool 5. The robot system 9 includes a transport vehicle 8 configured to move the robot 6. The robot 6 is fixed to the transport vehicle 8. The transport vehicle 8 of the present embodiment is an unmanned transport vehicle that automatically moves by a predetermined program. A supply box 98 containing a new fourth reel 94 is placed on the transport vehicle 8.

The robot 6 of the present embodiment is an articulated robot having a plurality of joints. The robot 6 includes an upper arm 61 and a lower arm 62. The lower arm 62 is supported by a rotation base 63. The rotation base 63 is supported by a base 64. The robot 6 includes a wrist 65 coupled to an end portion of the upper arm 61. The work tool 5 is fixed to the wrist 65. The robot is not limited to the configuration, and any robot that can change the position and the orientation of the work tool 5 can be adopted.

Figure 14:
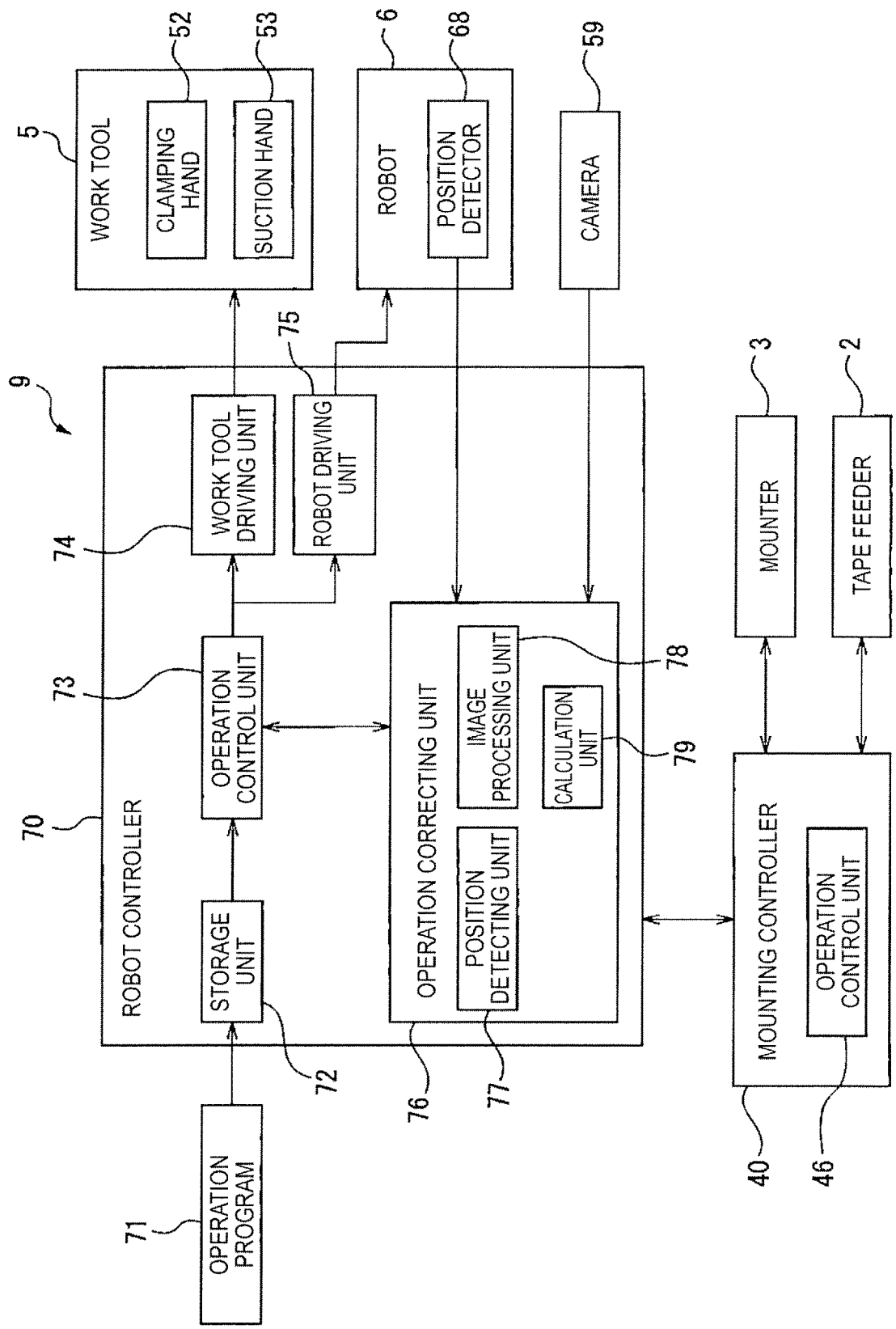
FIG. 14 is a block diagram of the robot system.
Figure 15:
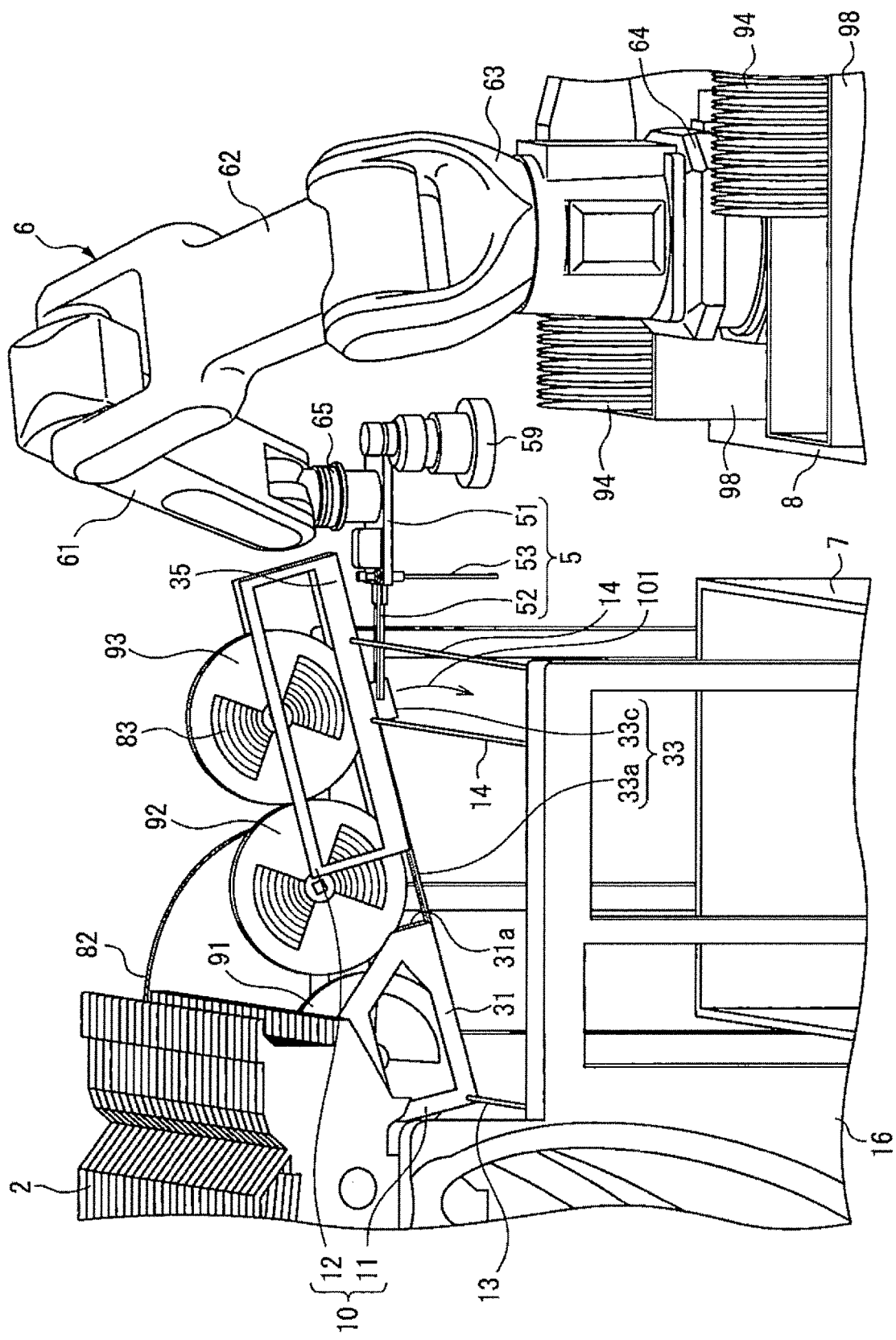
FIG. 15 is an enlarged perspective view of the reel holding part and a robot for illustrating a first step of an operation of replacing a reel with the robot.

FIG. 14 illustrates a block diagram of the robot system of the present embodiment. FIG. 15 illustrates a first enlarged perspective view of the reel holding part and the work tool of the present embodiment. In FIG. 15 to FIG. 20, for purposes of illustration, one reel holding part 10 among a plurality of reel holding parts 10 is described. Referring to FIG. 14 and FIG. 15, the work tool 5 of the present embodiment includes a base member 51 that is fixed to a flange of the wrist 65. The work tool 5 includes a clamping hand 52 as a first hand fixed to the base member 51. The clamping hand 52 has two fingers and the fingers open or close. The clamping hand 52 can grip the workpiece by sandwiching the workpiece. The clamping hand 52 operates the first reel support member 11. Further, the gripping hand 52 has a function of gripping the fourth reel 94 in order to supply a new fourth reel 94 to the second reel support member 12.

The work tool 5 includes a suction hand 53 serving as a second hand that is fixed to the base member 51. The suction hand 53 operates the second carrier tape 82 wound on the second reel 92. The suction hand 53 is formed to have a rod-shape. The suction hand 53 can grip the second carrier tape 82 by suction by reducing the pressure inside the suction hand 53.

Also, the robot system 9 in the present embodiment includes a camera 59 as a sensor configured to acquire the position of the leading end of the second carrier tape 82 of the second reel 92. The camera 59 is fixed to the base member 51 of the work tool 5. The camera 59 of the present embodiment is a two-dimensional camera. Note that the camera may be a three-dimensional camera.

The robot 6 includes a robot driving motor that changes the position and the orientation of the robot 6. The robot driving motor drives components such as an arm and a wrist. By the driving of the robot driving motor, the orientation of each component is changed. The work tool 5 includes a drive device such as a cylinder and a pump that drives the clamping hand 52 and the suction hand 53. By driving the drive device of the work tool 5, the fingers of the clamping hand 52 open or close. Furthermore, the suction hand 53 sucks or releases the workpiece.

The robot system 9 of the present embodiment includes a robot controller 70 that controls the robot 6 and the work tool 5. The robot controller 70 includes an arithmetic processing device (computer) that has a Central Processing Unit (CPU) as a processor. The arithmetic processing device includes a Random Access Memory (RAM), a Read Only Memory (ROM), or the like connected to the CPU via a bus. The robot controller 70 is input with an operation program 71 created in advance in order to perform the control of the robot 6 and the work tool 5. The operation program 71 is stored in a storage unit 72. The storage unit 72 can be configured by a storage medium, such as a volatile memory, a nonvolatile memory, or a hard disk, which are capable of storing information. The robot system 9 is driven based on the operation program 71.

An operation control unit 73 sends operation commands for driving the robot 6 based on the operation program 71 to a robot driving unit 75. The operation control unit 73 corresponds to a processor driven in accordance with the operation program 71. The processor is formed to be able to read information that is stored in the storage unit 72. The processor reads the operation program 71 and performs control that is determined in the operation program 71 so as to function as the operation control unit 73.

The robot driving unit 75 includes an electric circuit that drives the robot driving motor. The robot drive unit 75 supplies electricity to the robot driving motor based on the operation commands. Further, the operation control unit 73 sends operation commands that drive the hand 2 to a work tool driving unit 74 based on the operation program 71. The work tool driving unit 74 supplies electricity to the driving device in order to adjust the air pressure supplied to the clamping hand 52 and the air pressure inside the suction hand 53, based on the operation command. Further, the operation control unit 73 sends a command for capturing an image to the camera 59 based on the operation program 71.

The robot 6 includes a status detector for detecting the position and the orientation of the robot 6. The status detector of the present embodiment includes a position detector 68 attached to the robot driving motor corresponding to the driving axis. By the output of the position detector 68, the orientation of the component member on each drive axis can be acquired. By the output of the position detector 68, the position and the orientation of the work tool 5 are detected in addition to the position and the orientation of the robot 6.

The robot system 9 of the present embodiment includes a mounting controller 40 that controls the mounter 3 and the tape feeder 2. The mounting controller 40 is constituted by an arithmetic processing device (computer) that includes a CPU serving as a processor, a RAM, and the like. The mounting controller 40 includes an operation control unit 46 configured to deliver the operating commands to the mounter 3 and the tape feeder 2. The operation control unit 46 corresponds to a processor that is driven in accordance with the operation program 71. The processor functions as the operation control unit 46 by reading the operation program 71 and performing control determined in the operation program 71. Alternatively, the processor functions as the operation control unit 46, by being driven in accordance with the operation commands from the robot controller 70. The mounting controller 40 is formed so as to be able to communicate with the robot controller 70. The mounting controller 40 controls the mounter 3 and the tape feeder 2 based on the operation program.

In the state illustrated in FIG. 15, the first reel support member 11 is arranged at a reference position. In this state, the first reel 91 is prevented from moving by contacting the third contact part 31*c* of the first placement member 31 (see FIG. 5). Further, the second reel 92 is prevented from moving by contacting the first contact part 31*a* of the first placement member 31.

When the supply of the first carrier tape 81 of the first reel 91 is completed, the second carrier tape 82 of the second reel 92 is supplied to the mounter 3 by the tape feeder 2. The mounting controller 40 detects that the supply of the first carrier tape 81 is completed. The operation control unit 46 of the mounting controller 40 starts supplying the second carrier tape 82. The mounting controller 40 transmits to the robot controller 70 that the supply of the first carrier tape 81 is completed.

The robot controller 70 starts control of discharging the first reel 91. The robot 6 changes the position and the orientation so that the clamping hand 52 can grip the first reel support member 11. The clamping hand 52 grips the first reel support member 11. The clamping hand 52 of the present embodiment grips the knob part 33*c* of the operation part 33. The robot 6 changes the position and the orientation so that the knob part 33*c* moves downward. The first reel support member 11 rotates in the direction indicated by the arrow 101. The first reel support member 11 rotates from the reference position toward the discharge position.

Figure 16:
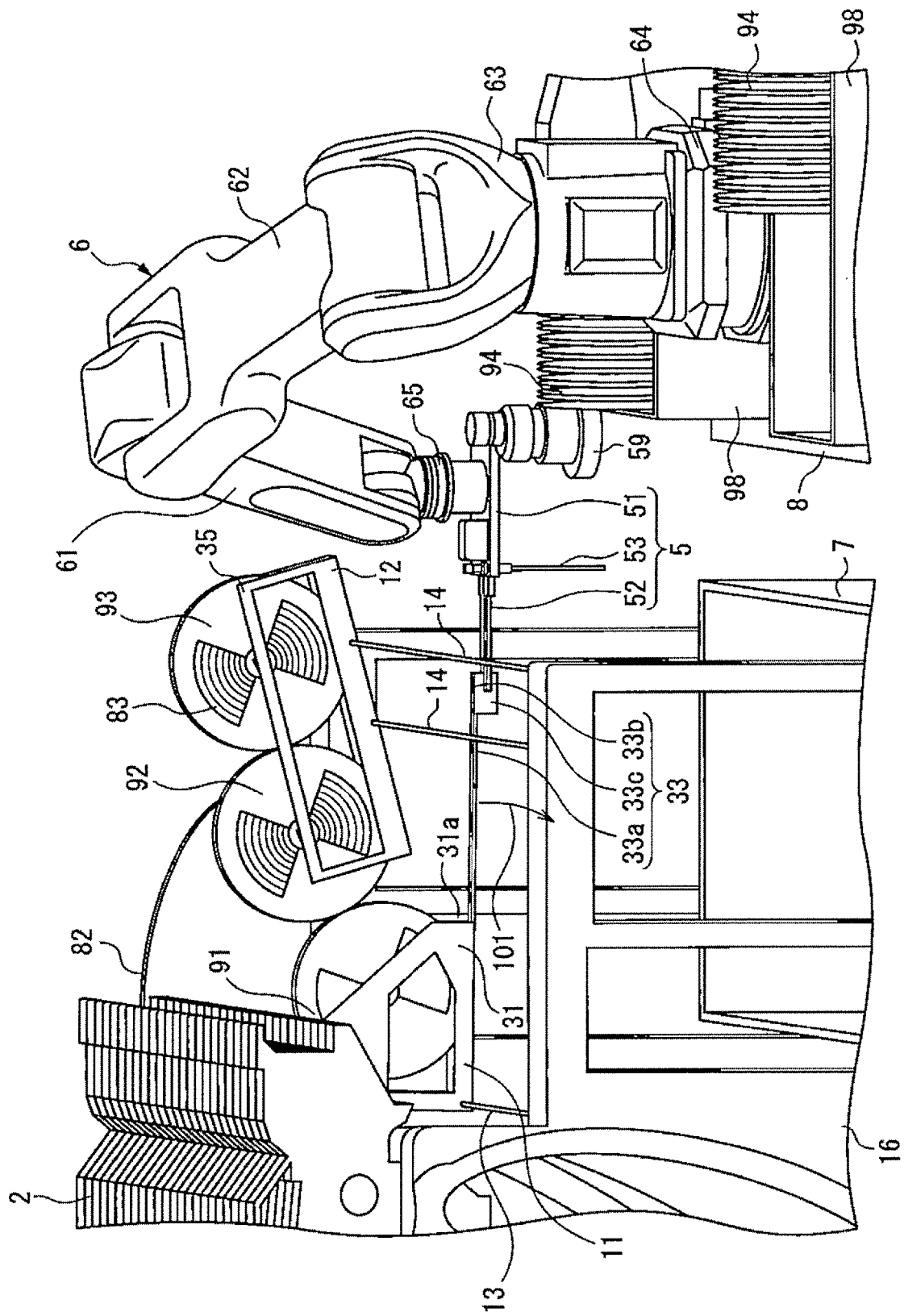
FIG. 16 is an enlarged perspective view of the reel holding part and the robot for illustrating a second step of the operation of replacing the reel with the robot.

FIG. 16 illustrates a second enlarged perspective view of the reel holding part and the work tool of the present embodiment. When the first reel support member 11 rotates, the second reel 92 moves away from the first contact part 31*a*. The second reel 92 is prevented from moving by contacting the first reel 91. Meanwhile, the second carrier tape 82 of the second reel 92 continues to be supplied to the mounter 3 by the tape feeder 2.

Figure 17:
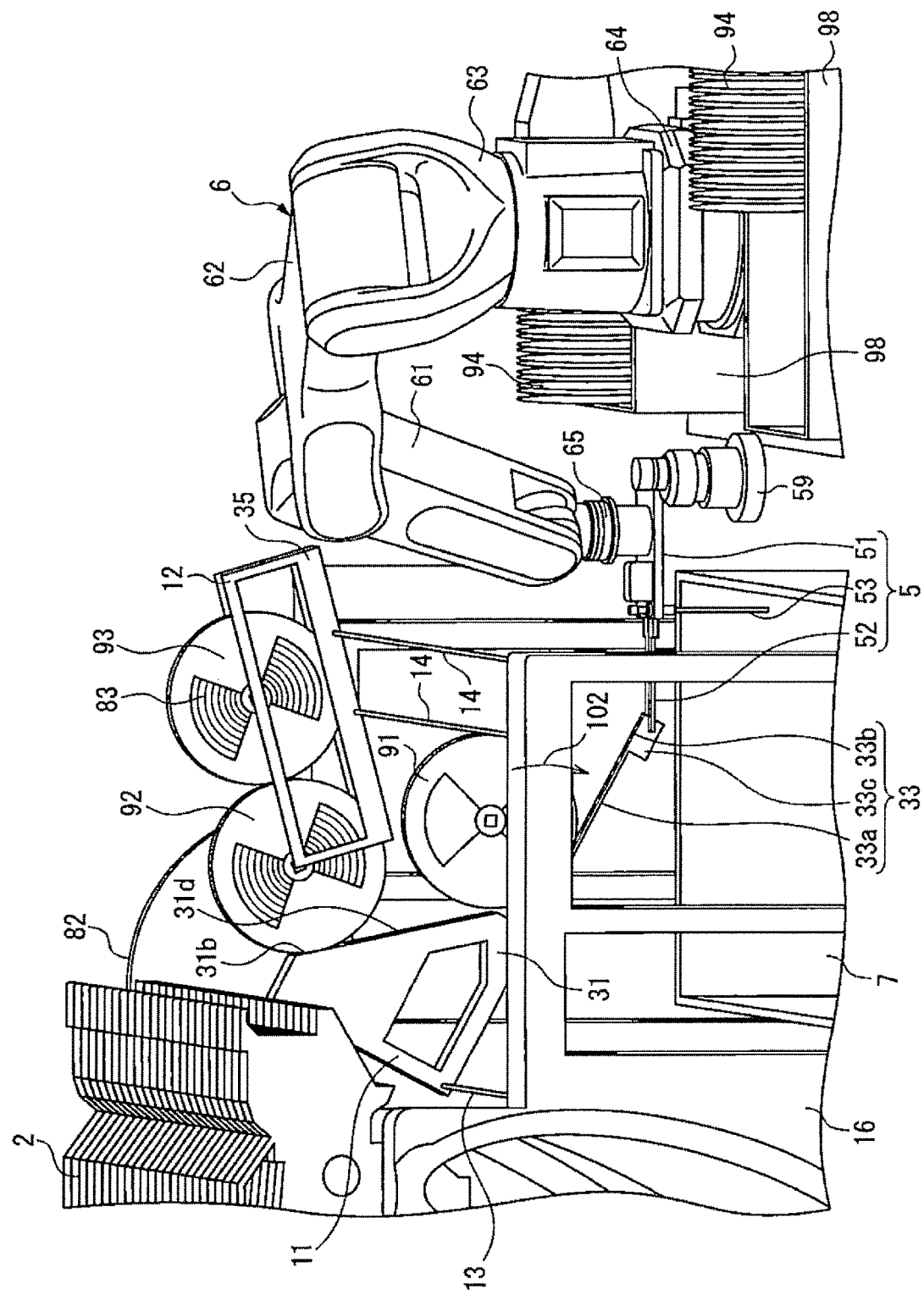
FIG. 17 is an enlarged perspective view of the reel holding part and the robot for illustrating a third step of the operation of replacing the reel with the robot.
Figure 18:
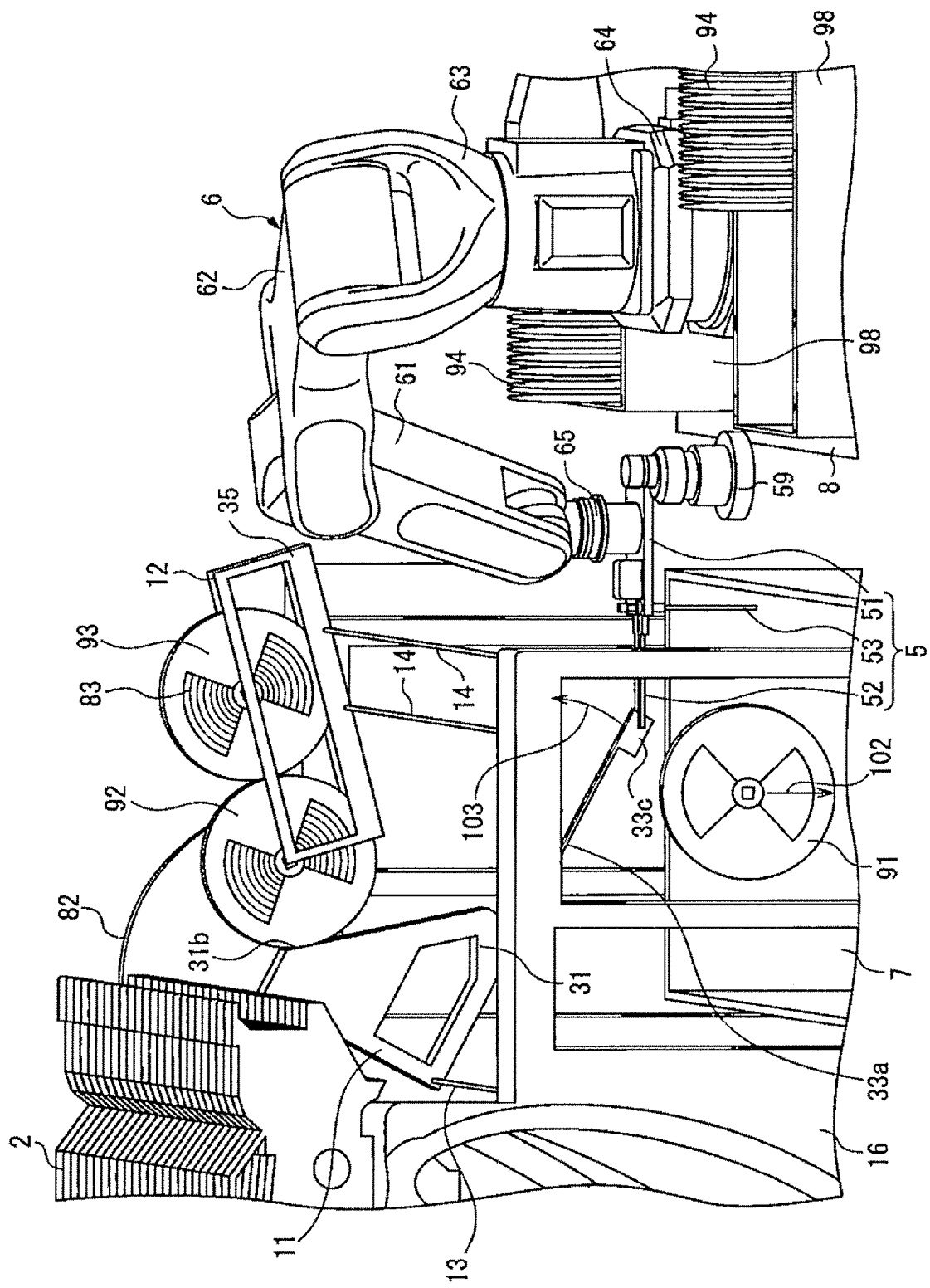
FIG. 18 is an enlarged perspective view of the reel holding part and the robot for illustrating a fourth step of the operation of replacing the reel with the robot.

FIG. 17 is a third enlarged perspective view of the reel holding part and the work tool of the present embodiment. FIG. 18 illustrates a fourth enlarged perspective view of the reel holding part and the work tool of the present embodiment. Referring to FIG. 17 and FIG. 18, the robot 6 further rotates the first reel support member 11 in the direction indicated by the arrow 101. The first reel 91 drops from the opening 31d of the first placement member 31, as indicated by the arrow 102. The first reel 91 is collected in the collection box 7. At this time, the second reel 92 is prevented from moving by the second contact part 31b of the first placement member 31.

The robot 6 rotates the first reel support member 11 to the discharge position. Thereafter, as indicated by the arrow 103, the robot 6 changes the position and the orientation so that the first reel support member 11 returns from the discharge position to the reference position. The robot 6 moves the knob part 33c upward and rotates the first reel support member 11.

Figure 19:
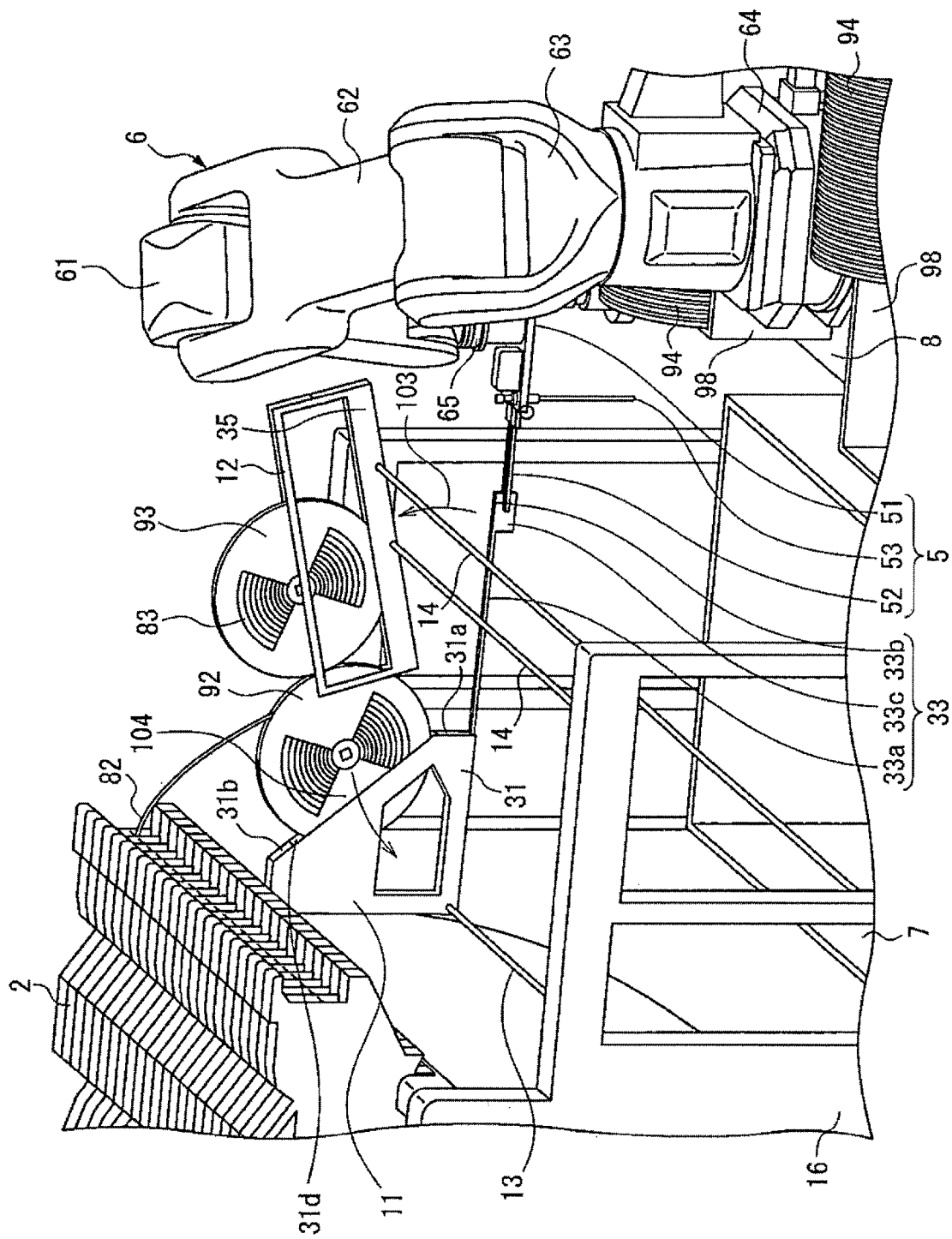
FIG. 19 is an enlarged perspective view of the reel holding part and the robot for illustrating a fifth step of the operation of replacing the reel with the robot.

FIG. 19 illustrates a fifth enlarged perspective view of the reel holding part and the work tool of the present embodiment. As indicated by the arrow 103, by rotating the first reel support member 11 toward the reference position, the second reel 92 moves away from the second contact part 31b of the first placement member 31. The opening 31d of the first placement member 31 and the second reel 92 face each other. The second reel 92 moves toward the interior of the first placement member 31. The second reel 92 is contained in the first placement member 31, as indicated by arrow 104.

Figure 20:
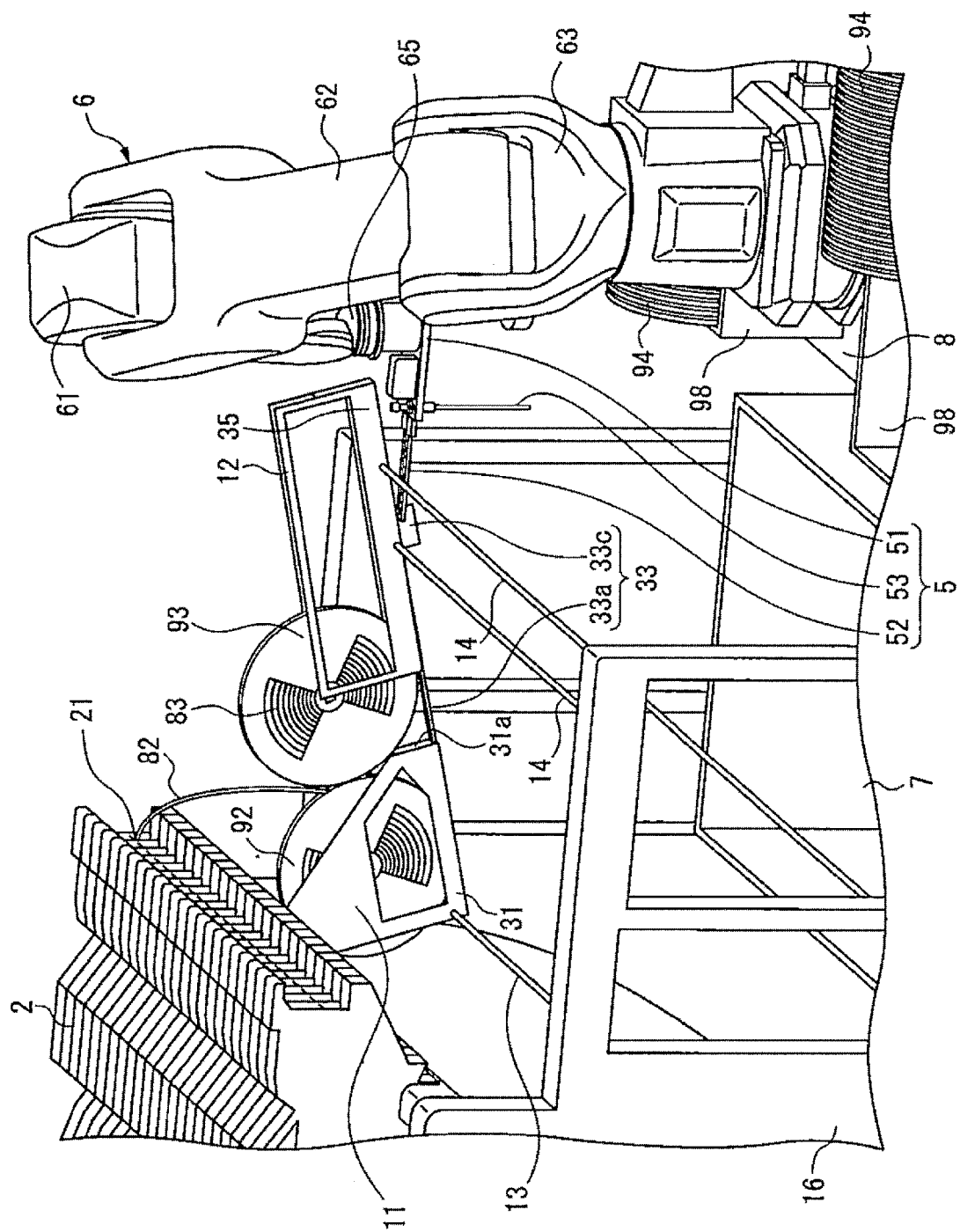
FIG. 20 is an enlarged perspective view of the reel holding part and the robot for illustrating a sixth step of the operation of replacing the reel with the robot.

FIG. 20 illustrates a sixth enlarged perspective view of the reel holding part and the work tool of the present embodiment. By changing the position and the orientation of the robot 6 so that the knob part 33c rises, the magnet 33b of the operation part 33 contacts the bottom surface of the second placement member 35. The rod-shaped part 33a of the operation part 33 can be fixed to the bottom surface of the second placement member 35 by the effect of the magnet 33b. The first reel support member 11 is fixed at a reference position. The third reel 93 rotates toward the first placement member 31. The third reel 93 is prevented from moving by contacting the first contact part 31a of the first placement member 31.

As such, by driving the robot 6, the first reel 91 whose use is completed can be discharged, and the second reel 92 can move to the first reel support member 11. In a state where the mounting of the components by the mounter 3 is continued, the reel can be replaced. The second carrier tape 82 of the second reel 92 continues to be supplied to the mounter 3 by the tape feeder 2. Next, the robot 6 performs the operation of inserting the third carrier tape 83 of the third reel 93 into the supply port 21 of the tape feeder 2.

Figure 21:
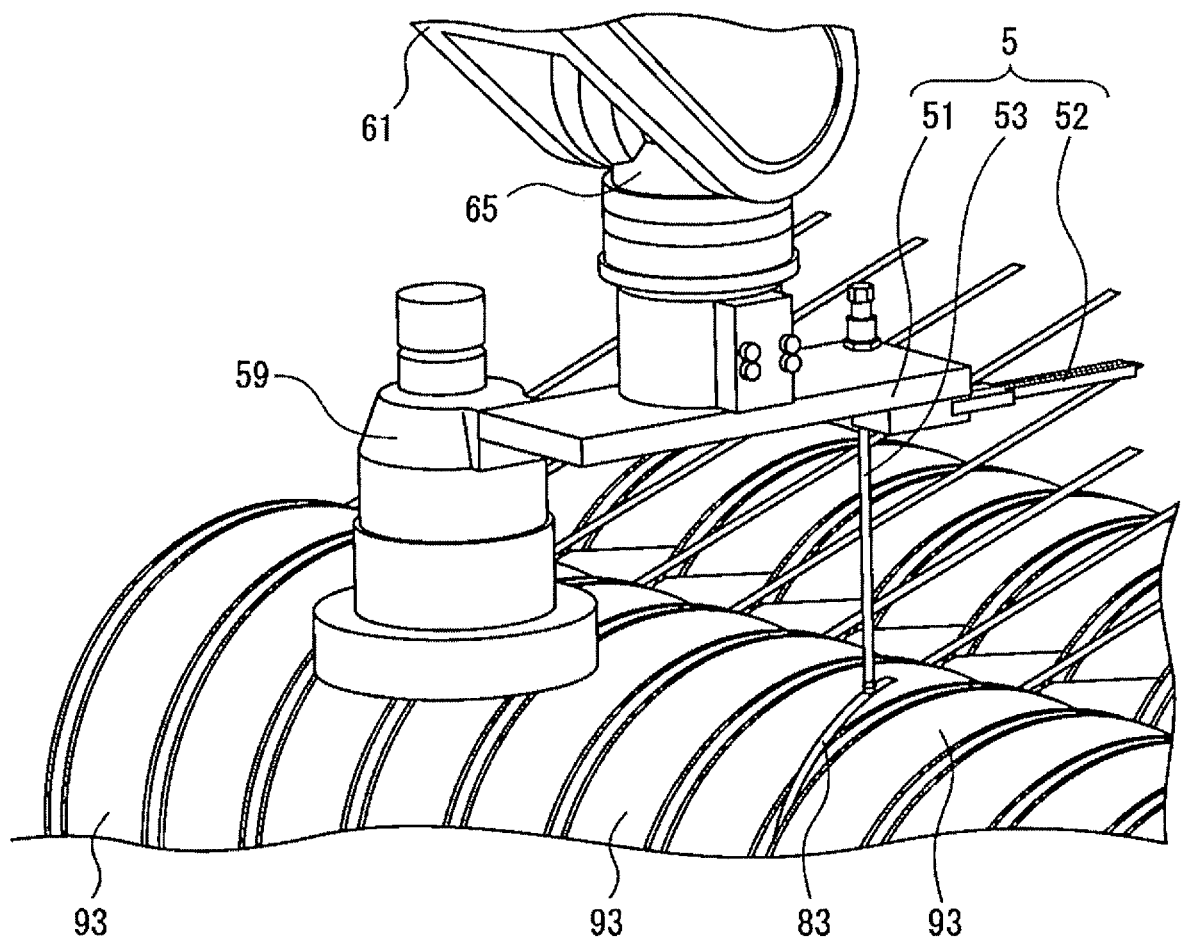
FIG. 21 is an enlarged perspective view of a work tool and the reel showing a state in which a suction hand of the embodiment grips a carrier tape.

FIG. 21 illustrates a partial enlarged perspective view of the work tool and the third reel. Referring to FIG. 14 and FIG. 21, the robot controller 70 of the present embodiment includes an operation correcting unit 76 that corrects the operation of the robot 6 based on the operation program 71. The camera 59 captures a reel or carrier tape as a workpiece. The operation correcting unit 76 includes an image processing unit 78 that processes the image captured by the camera 59. The operation correcting unit 76 includes a position detecting unit 77 configured to detect the position of the workpiece based on the image processed by the image processing unit 78. Further, the operation correcting unit 76 includes a calculation unit 79 that calculates a correction amount of the position and the orientation of the robot 6 so as to reliably operate the workpiece based on the position of the workpiece detected by the position detecting unit 77.

Each unit of the operation correcting unit 76, the image processing unit 78, the position detecting unit 77, and the calculation unit 79 correspond to a processor that is driven in accordance with the operation program 71. The processor functions as each unit by reading the operation program and performing control that is determined in the operation program.

The third reel 93 of the present embodiment moves within the second reel support member 12. To this end, in the second reel support member 12, the position at which the third reel 93 is arranged changes. The position of the leading end of the carrier tape 83 wound on the third reel 93 also changes.

In the robot system 9 of the present embodiment, the robot 6 changes the position and the orientation so that the camera 59 can capture an image of the third carrier tape 83 that is wound on the third reel 93. The camera 59 captures an image of the third carrier tape 83 that is wound on the third reel 93. The image processing unit 78 processes the image captured by the camera 59. The position detecting unit 77 detects the position of the leading end of the carrier tape 83. In the present embodiment, the position detecting unit 77 can detect the position of the two-dimensional workpiece. For example, the position of the workpiece in the horizontal direction can be detected by capturing with the camera 59 facing downward in the vertical direction.

Here, the leading end of the third carrier tape 83 may be arranged in a range that cannot be gripped by the suction hand 53. For example, the leading end of the third carrier tape 83 may not be captured in the image captured by the camera 59. In this case, the position detecting unit 77 detects the position of the third reel 93. Based on the position of the third reel 93 that is detected by the position detecting unit 77, the operation correcting unit 76 sends an operation command for gripping the third reel 93 by the clamping hand 52 to the operation control unit 73. In addition, the operation correcting unit 76 sends an operation command of rotating the third reel 93 by the robot 6 to the operation control unit 73. For example, the operation correcting unit 76 sends an operating command of controlling the robot 6 so as to rotate the third reel at a predetermined rotation angle. In this manner, the third reel 93 is rotated until the position of the leading end of the carrier tape 83 is arranged within a range that can be gripped by the suction hand 53.

In a case where the position of the leading end of the third carrier tape 83 is detected by the position detecting unit 77, based on the position of the tip of the carrier tape 83, the calculation unit 79 calculates the correction amount of the operation program 71 with respect to the position and the orientation of the robot 6 for gripping the carrier tape 83 by the suction hand 53. The correction amount of the position and the orientation of the robot 6 are sent to the operation control unit 73. The operation control unit 73 corrects the position and the orientation of the robot 6 based on the operation program 71 and the correction amount of the position and the orientation.

Referring to FIG. 21, in this position and orientation of the robot 6 that are corrected, the suction hand 53 grips the leading end of the third carrier tape 83 that is wound on the third reel 93. Thereafter, the robot 6 changes the position and the orientation such that the leading end of the third carrier tape 83 is inserted into the supply port 21 of the tape feeder 2. In this way, the leading end of the third carrier tape 83 can be inserted into the supply port 21 of the tape feeder 2. The third carrier tape 83 is held in the interior of the tape feeder 2.

Referring to FIG. 20, the robot 6 of the present embodiment arranges a new fourth reel 94 that is arranged in the supply box 98 in the second reel support member 12. In this case, by capturing an image of the reel 94 by the camera 59, the operation correcting unit 76 can acquire the correct position of reel 94. Then, the robot 6 can grip the reel 94 and arrange the reel 94 on the second placement member 35 of the second reel support member 12. As a result, as illustrated in FIG. 15, it can be a state that one reel is arranged on the first reel support member 11 and two reels are arranged on the second reel support member 12. Thereafter, the control described above can be repeatedly performed each time when the supply of the carrier tape of the reel that is arranged on the first reel support member 11 is completed.

In the robot system of the present embodiment, reel replacement that is difficult in the related art can be performed by a robot. Reel replacement can also be performed automatically without stopping the mounter.

In the robot system 9 of the present embodiment, the tape feeder 2 includes a mechanism configured to continuously supply the second carrier tape 82 so as to follow the first carrier tape 81 when the supply of the first carrier tape 81 of the first reel 91 is completed. After the first reel support member 11 is returned from the discharge position to the reference position, the suction hand 53 grips the third carrier tape 83 that is wound on the third reel 93 that is placed on the second placement member 35. The robot 6 changes the position and the orientation so as to supply the third carrier tape 83 to the supply port 21 of the tape feeder 2. By performing this control, the carrier tape that is next used can be automatically supplied to the tape feeder 2. Note that this operation may be performed by an operator. Alternatively, this operation may be performed by a device other than a robot.

Furthermore, in the robot system 9 of the present embodiment, during a period in which the second carrier tape 82 of the second reel 92 is supplied to the mounter 3, the robot 6 supplies the third carrier tape 83 that is wound on the third reel 93 to the supply port 21 of the tape feeder 2. By adopting this control, the reel can be replaced automatically without stopping the mounter 3.

Furthermore, the robot system 9 of the present embodiment includes the supply box 98 in which the new fourth reel 94 is arranged. The clamping hand 52 grips the fourth reel 94 and the robot 6 changes the position and orientation position so as to supply the fourth reel 94 to the second reel support member 12. According to this configuration, a new reel can be supplied to the component mounting machine 4 by the robot 6. In particular, in the robot system 9 of the present embodiment, the carrier vehicle 8 automatically moves and a new tape can be supplied by the robot 6.

Note that the robot 6, the work tool 5, and the carrier vehicle 8 may be controlled so as to collect the reel contained in the collection box 7. According to this configuration, in addition to the mounting of the components by the component mounting machine, the reel for which the supply of the carrier tape is completed can be automatically collected.

According to an aspect of the present disclosure, it is possible to provide a reel holding device for easily performing an operation of removing a reel for which the supply of the carrier tape is completed and an operation of arranging a new reel, and a robot system including this reel holding device and a robot.

In each control described above, the order of the steps can be changed as appropriate as long as the function and the effect are not changed.

The above embodiments can be combined as appropriate. In each of the above figures, the same or the equivalent portions are denoted by the same reference numerals. Note that the above-described embodiments are merely examples and are not intended to limit the invention. Further, in the embodiments, modifications of the embodiment described in the claims are included.

The invention claimed is:

1. A reel holding device that is arranged in a component mounting machine including a mounter configured to mount a component on a surface of a substrate and that is configured to hold a reel on which a carrier tape holding a component is wound, the reel holding device comprising:
   a first reel support member including a first placement member configured to rotatably support a first reel; and
   a second reel support member including a second placement member configured to support a second reel, wherein
   the first reel support member is rotatable between a reference position that is a position at which a carrier tape of the first reel is supplied to the mounter and a discharge position that is a position for discharging the first reel,
   the second placement member is arranged such that a region where the second reel is arranged and a region of the first placement member where the first reel is arranged are aligned linearly,
   the first placement member includes a first contact part formed on a portion facing the second placement member when the first reel support member is arranged in the reference position, a second contact part formed on a portion facing the second placement member when the first reel support member is arranged in the discharge position, and an opening formed in a region between the first contact part and the second contact part and having a size through which the second reel can pass,
   the second reel is in contact with the first contact part and is prevented from moving to an interior of the first placement member when the first reel support member is arranged in the reference position, and the second reel is in contact with the second contact part and is prevented from moving to the interior of the first placement member when the first reel support member is arranged in the discharge position, and
   the first reel drops from the first placement member through the opening and is discharged by the first reel support member rotating from the reference position toward the discharge position, and the second reel moves through the opening and into the interior of the first placement member when the first reel support member returns from the discharge position to the reference position.

2. The reel holding device according to claim 1, wherein the second placement member is arranged inclined with respect to a horizontal direction such that the second reel rotates toward the first placement member.

3. The reel holding device according to claim 1, wherein the first reel support member includes an operation part formed to extend from the first placement member along the second placement member, and
   the operation part includes a rod-shaped part formed to extend from the first placement member along a bottom surface of the second placement member, and a fixing part configured to fix the rod-shaped part to the second placement member.

4. The reel holding device according to claim 1, wherein the component mounting machine includes a tape feeder configured to supply the carrier tape to the mounter; and the tape feeder has a mechanism configured to supply the carrier tape of the first reel to the mounter and hold a carrier tape of the second reel inside the tape feeder, and supply the carrier tape of the second reel to the mounter so as to follow the carrier tape of the first reel when the supply of the carrier tape of the first reel is completed.

5. A robot system, comprising:

a component mounting machine including the reel holding device of claim 1;

a work tool including a first hand configured to operate the first reel support member and a second hand configured to operate a carrier tape wound on a third reel placed on the second placement member;

a robot configured to change a position and an orientation of the work tool; and a robot controller configured to control the robot and the work tool, wherein the component mounting machine includes a tape feeder configured to supply a carrier tape of the first reel to the mounter, and after the supply of the carrier tape of the first reel is completed, the first hand grips the first reel support member and the robot changes the position and the orientation such that the first reel support member rotates from the reference position to the discharge position, and further, the position and the orientation are changed so that the first reel support member returns from the discharge position to the reference position.

6. The robot system according to claim 5, wherein the tape feeder has a mechanism configured to supply the carrier tape of the first reel to the mounter and hold the carrier tape of the second reel inside the tape feeder, and supply the carrier tape of the second reel to the mounter so as to follow the carrier tape of the first reel when the supply of the carrier tape of the first reel is completed, and after the first reel support member returns from the discharge position to the reference position, the second hand grips the carrier tape wound on the third reel placed on the second placement member, and the robot changes the position and the orientation so as to supply the carrier tape wound on the third reel to a supply port of the tape feeder.

7. The robot system according to claim 6, wherein during a period in which the carrier tape of the second reel is supplied to the mounter, the robot changes the position and the orientation so as to supply the carrier tape wound on the third reel to the supply port of the tape feeder.

8. The robot system according to claim 5, further comprising a supply box containing a fourth reel on which a carrier tape is wound, wherein after the first reel support member returns from the discharge position to the reference position, the first hand grips the fourth reel contained in the supply box, and the robot changes the position and the orientation so as to arrange the fourth reel in the second placement member.

* * * * *